(12) United States Patent
Muroga et al.

(10) Patent No.: US 7,789,977 B2
(45) Date of Patent: Sep. 7, 2010

(54) ROLLED COPPER FOIL AND MANUFACTURING METHOD THEREOF

(75) Inventors: Takemi Muroga, Tsuchiura (JP); Yasuyuki Ito, Tsuchiura (JP); Koji Aoyagi, Tsuchiura (JP); Yoshiki Yamamoto, Tsukuba (JP); Kenji Yokomizo, Tokyo (JP); Katsumi Nomura, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 625 days.

(21) Appl. No.: 11/682,943

(22) Filed: Mar. 7, 2007

(65) Prior Publication Data
US 2008/0099110 A1    May 1, 2008

(30) Foreign Application Priority Data

Oct. 26, 2006  (JP)  ............................. 2006-290880
Oct. 26, 2006  (JP)  ............................. 2006-290884

(51) Int. Cl.
C22C 9/00      (2006.01)
C22F 1/08      (2006.01)

(52) U.S. Cl. ..................................... 148/432; 148/684

(58) Field of Classification Search ........................ None
See application file for complete search history.

(56) References Cited

U.S. PATENT DOCUMENTS 6,372,061 B1     4/2002   Hatano et al.
6,689,235 B2 *   2/2004   Hatano et al. ............... 148/681
7,087,113 B2 *   8/2006   Goyal .......................... 117/84

FOREIGN PATENT DOCUMENTS

| JP | 11-286760   | 10/1999 |
| JP | 2000-212661 | 8/2000  |
| JP | 2000-256765 | 9/2000  |
| JP | 2001-262296 | 9/2001  |
| JP | 2001-323354 | 11/2001 |
| JP | 2005-068484 | 3/2005  |
| JP | 2006-117977 | 5/2006  |

* cited by examiner

Primary Examiner—Roy King
Assistant Examiner—Yoshitoshi Takeuchi
(74) Attorney, Agent, or Firm—Antonelli, Terry, Stout & Kraus, LLP.

(57) ABSTRACT

A rolled copper foil applied with a recrystallization annealing after a final cold rolling step and having a crystal grain alignment satisfying a ratio of $[a]/[b] \geq 3$, where [a] and [b] are normalized average intensities of a $\{111\}_{Cu}$ plane diffraction of a copper crystal by β-scanning at $\alpha=35°$ and $74°$, respectively, in an X-ray diffraction pole figure measurement to a rolled surface is manufactured by controlling a total working ratio in the final cold rolling step before the recrystallization annealing to be 94% or more; and controlling a working ratio per one pass in the final cold rolling step to be 15 to 50%.

10 Claims, 11 Drawing Sheets

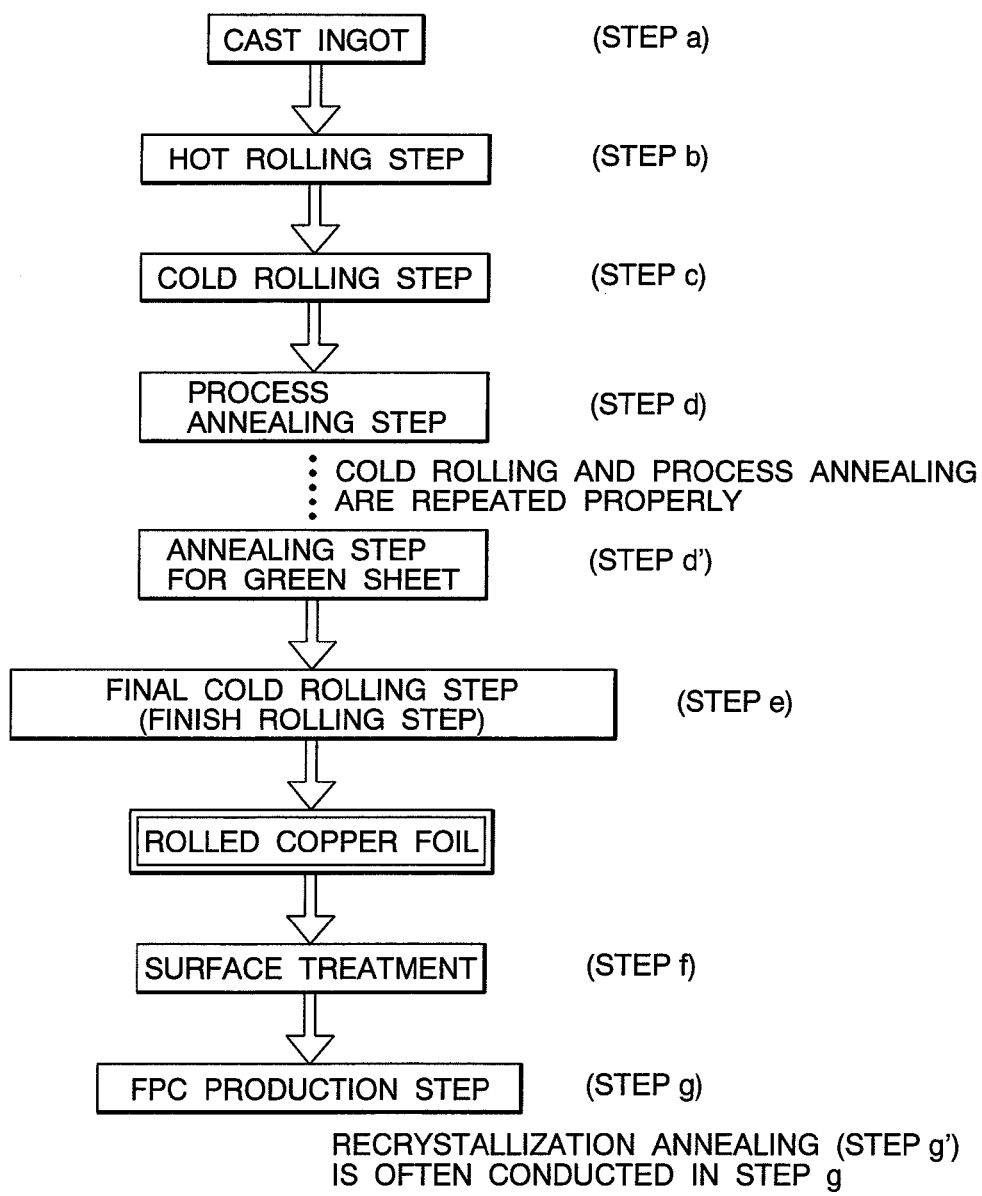

ROLLED COPPER FOIL AND MANUFACTURING METHOD THEREOF

The present application is based on Japanese patent application Nos. 2006-290880 and 2006-290884, the entire contents of which are incorporated herein by reference.

BACKGROUND OF THE INVENTION

1. Field of the Invention

The present invention concerns a rolled copper foil and particularly, it relates to a rolled copper foil having an excellent flexible fatigue property suitable for flexible wiring materials such as flexible printed circuits, as well as a manufacturing method thereof.

2. Description of the Related Art

Flexible printed circuits (hereinafter simply referred to as FPC) have high freedom in a mounting form to electronic equipments due to their attractive features of small thickness and excellent flexibility. Accordingly, FPCs have been used generally, for example, as wirings for bending portions of foldable (clamshell type) cellular phones, movable portions of digital cameras, printer heads, etc., and movable portions of equipment relevant to disks such as HDDs (Hard Disk Drives), DVDs (Digital Versatile Disks) and CDs (Compact Disks).

As conductors for FPC, pure copper or copper alloy foils (hereinafter simply referred to as "copper foils") applied with various surface treatments have generally been used. The copper foils are classified into electrodeposited copper foils and rolled copper foils according to the manufacturing methods thereof. Since FPCs are used as wiring materials for repetitive movable portions as described above, excellent flexible fatigue properties (e.g., flexible fatigue property of 1,000,000 cycles or more) have been required and rolled copper foils are often selected as the copper foils.

Generally, the rolled copper foils are manufactured by applying a hot rolling step to a cast ingot made of a tough pitch copper (JIS H3100 C1100) or an oxygen-free copper (JIS H3100 C1020) as a raw material, and then by repeating a cold rolling step and a process annealing step to a predetermined thickness. The thickness of the rolled copper foils required for using in FPCs is usually 50 μm or less and it has tended to be decreased further as 10 and several μm or less in recent years.

The FPC manufacturing step generally includes "a step of bonding a copper foil and a base film (base material) comprising a resin such as a polyimide to form a CCL (Copper Cladded Laminate (CCL step))", "a step of forming a printed circuit by a method such as etching for CCL", "a step of applying a surface treatment on the circuit for protection of wirings", etc. The CCL step includes two kinds of methods, i.e., a method of laminating a copper foil and a base material with an adhesive and then curing and adhering the adhesive by a heat treatment (3-layered CCL), and a method of directly bonding a copper foil applied with a surface treatment with a base material without an adhesive and then integrating them by heating and pressing (2-layered CCL).

In the FPC manufacturing step, copper foils as cold rolled (hard state which is work hardened) has often been used from a view point of easy handling. In a case where the copper foil is in an annealed (softened) state, the copper foil is easy to deform (e.g., elongation, creasing, flexing, etc.) upon cutting of the copper foil or lamination with the base material resulting in product failure.

On the other hand, the flexible fatigue property of the copper foil is improved remarkably by applying a recrystallization annealing than that of the copper foil in the as-cold rolled state. Then, a manufacturing method in which the heat treatment for adhering the base material and the copper foil in the CCL step is also served for the recrystallization annealing for the copper foil has been generally selected. The heat treatment condition in this case is usually at a temperature of 180 to 300° C. for 1 to 60 min (e.g., at 200° C. for 30 min) and the copper foil is in a state refined into a recrystallization texture.

For improving the flexible fatigue property of FPC, it is effective to improve the flexible fatigue property of the rolled copper foil as the material thereof. Further, it has been known that the flexible fatigue property of the copper foil after recrystallization annealing is improved more as a cubic texture is developed. "Development of the cubic texture" referred to generally only means that the occupation ratio of a $\{200\}_{Cu}$ plane is high at the rolled surface (e.g., 85% or more).

Heretofore, for rolled copper foils with excellent flexible fatigue property, there have been reported, for example, a method of developing the cubic texture by increasing a final rolling working ratio (e.g., to 90% or more), a copper foil defined for the degree of development of the cubic texture after recrystallization annealing (e.g., the intensity of a $(200)_{Cu}$ plane determined by X-ray diffraction at the rolled surface is greater by more than 20 times than that determined by powder X-ray diffractometry), a copper foil defined for the ratio of penetration crystal grains in the direction of thickness of the copper foil (e.g., 40% or more as a cross sectional area ratio), a copper foil controlled for the softening temperature by the addition of small amount of additive elements (e.g., controlled to a half-softening temperature of 120 to 150° C.), a copper foil defined for the length of a twin boundary (e.g., the total length of the twin boundary with a length exceeding 5 μm per 1 mm² area is 20 mm or less), a copper foil controlled for the recrystallization texture by the addition of additive elements (e.g., the Sn is added by 0.01 to 0.2 mass % to control the average crystal grain size of 5 μm or less and the maximum crystal grain size of 15 μm or less), etc. (e.g., JP No. 3009383, JP-A No. 2006-117977, JP-A No. 2000-212661, JP-A No. 2000-256765, JP-A No. 2001-323354, JP-A No. 2001-262296, and JP-A No. 2005-68484).

However, along with development in the reduction of size, increase in the integration degree (higher density mounting) and higher performance of electronic equipment in recent years, further higher requirement for flexible fatigue property has been increased more and more than usual for the FPC. Since the flexible fatigue property of the FPC is determined substantially depending on that of the copper foil, it is essential to further improve the flexible fatigue property of the copper foil for satisfying the demand.

SUMMARY OF THE INVENTION

Accordingly, it is an object of the present invention to provide a rolled copper foil which has more excellent flexible fatigue property than usual and which is suitable to flexible wiring materials such as for flexible printed circuits (FPC). It is a further object of the present invention to provide a manufacturing method capable of stably manufacturing a rolled copper foil having more excellent flexible fatigue property than usual.

As the results of detail analyzing the metal crystallographic studies on the formation of a cubic texture by a recrystallization annealing in a rolled copper foil by the inventors, it is found that there is a predetermined correlationship for the state of crystal grain alignment before the recrystallization annealing, that after the recrystallization annealing, and the flexible fatigue property. Based on this finding, the inventors have completed the invention as described below.

(1) According to a first aspect of the invention, a rolled copper foil comprises:

a rolled copper foil applied with a recrystallization annealing after a final cold rolling step, and having a crystal grain alignment satisfying a ratio of $[a]/[b] \geqq 3$, where [a] and [b] are normalized average intensities of a $\{111\}_{Cu}$ plane diffraction of a copper crystal by β-scanning at α=35° and 74°, respectively, in an X-ray diffraction pole figure measurement to a rolled surface.

In the above invention (1), the following modifications and changes can be made.

(i) An average of full width at half maximum of diffraction peaks (ave–$FWHM_{\{111\}}$) of the $\{111\}_{Cu}$ plane in geometrical correlation with the $\{200\}_{Cu}$ plane of the rolled surface is 100 or less in the X-ray diffraction in-plane alignment measurement.

(ii) 90% or more of diffraction peak of a copper crystal is a $\{200\}_{Cu}$ plane diffraction in an X-ray diffraction 2θ/θ measurement to the rolled surface; and a full width at half maximum of the $\{200\}_{Cu}$ plane diffraction peak ($FWHM_{\{200\}}$) is 10° or less in an X-ray diffraction rocking curve measurement.

(iii) A ratio between a full width at half maximum ($FWHM_{\{200\}}$) and an integration width ($IW_{\{200\}}$) is $0.85 \leqq IW_{\{200\}}/FWHM_{\{200\}} \leqq 1.15$ in the X-ray diffraction rocking curve measurement of the $\{200\}_{Cu}$ plane diffraction; and a ratio between a full width at half maximum $FWHM_{\{111\}}$ and an integration width ($IW_{\{111\}}$) among four-fold symmetric diffraction peaks of the $\{111\}_{Cu}$ plane in geometrical correlation with the $\{200\}_{Cu}$ plane of the rolled surface is $0.85 \leqq IW_{\{111\}}/FWHM_{\{111\}} \leqq 1.15$ in the X-ray diffraction in-plane alignment measurement.

(iv) An average grain size of the recrystallized grains observed on the rolled surface is 40 μm or more.

(v) A copper alloy comprising 0.001 to 0.009 mass % of Sn, the balance consisting of Cu and an inevitable impurity is used.

(2) According to a second aspect of the invention, a rolled copper foil comprises:

a rolled copper foil after a final cold rolling step and before a recrystallization annealing, and having a crystal grain alignment indicating that a normalized average intensity of a $\{111\}_{Cu}$ plane diffraction of copper crystal by β-scanning in a range of α angle of 35° to 75° is not in a stepwise form, or has substantially only by one maximal region in an X-ray diffraction pole figure measurement to a rolled surface.

In the above invention (2), the following modifications and changes can be made.

(vi) 80% or more of diffraction peak of a copper crystal is a $\{220\}_{Cu}$ plane diffraction in an X-ray diffraction 2θ/θ measurement to the rolled surface.

(vii) A copper alloy comprising 0.001 to 0.009 mass % of Sn, the balance consisting of Cu and an inevitable impurity is used.

(3) According to a third aspect of the invention, a method of manufacturing a rolled copper foil comprises:

a rolled copper foil after a final cold rolling step and before a recrystallization annealing, and having a crystal grain alignment indicating that a normalized average intensity of a $\{111\}_{Cu}$ plane diffraction of copper crystal by β-scanning in a range of α angle of 35° to 75° is not in a stepwise form, or has substantially only by one maximal region in an X-ray diffraction pole figure measurement to a rolled surface;

wherein controlling a total working ratio in the final cold rolling step before the recrystallization annealing to be 94% or more; and controlling a working ratio per one pass in the final cold rolling step to be 15 to 50%.

In the above invention (3), the following modifications and changes can be made.

(viii) Controlling the working ratio of one pass in the final cold rolling step to be "working ratio at first pass"≧"working ratio at second pass"≧"working ratio at third pass"; and controlling the working ratio at third or more passes in the final cold rolling step to be 15 to 25%.

ADVANTAGES OF THE INVENTION

According to the invention, it is possible to provide a rolled copper foil suitable for a flexible wiring material such as a flexible printed circuit (FPC) and having more excellent flexible fatigue property than usual. Further, it is possible to provide a manufacturing method of stably manufacturing a rolled copper foil having more excellent flexible fatigue property than usual.

BRIEF DESCRIPTION OF THE DRAWINGS

FIG. 9 is a flowchart showing steps of manufacturing a rolled copper foil in a preferred embodiment according to the invention.

DETAILED DESCRIPTION OF THE PREFERRED EMBODIMENTS

Figure 1:
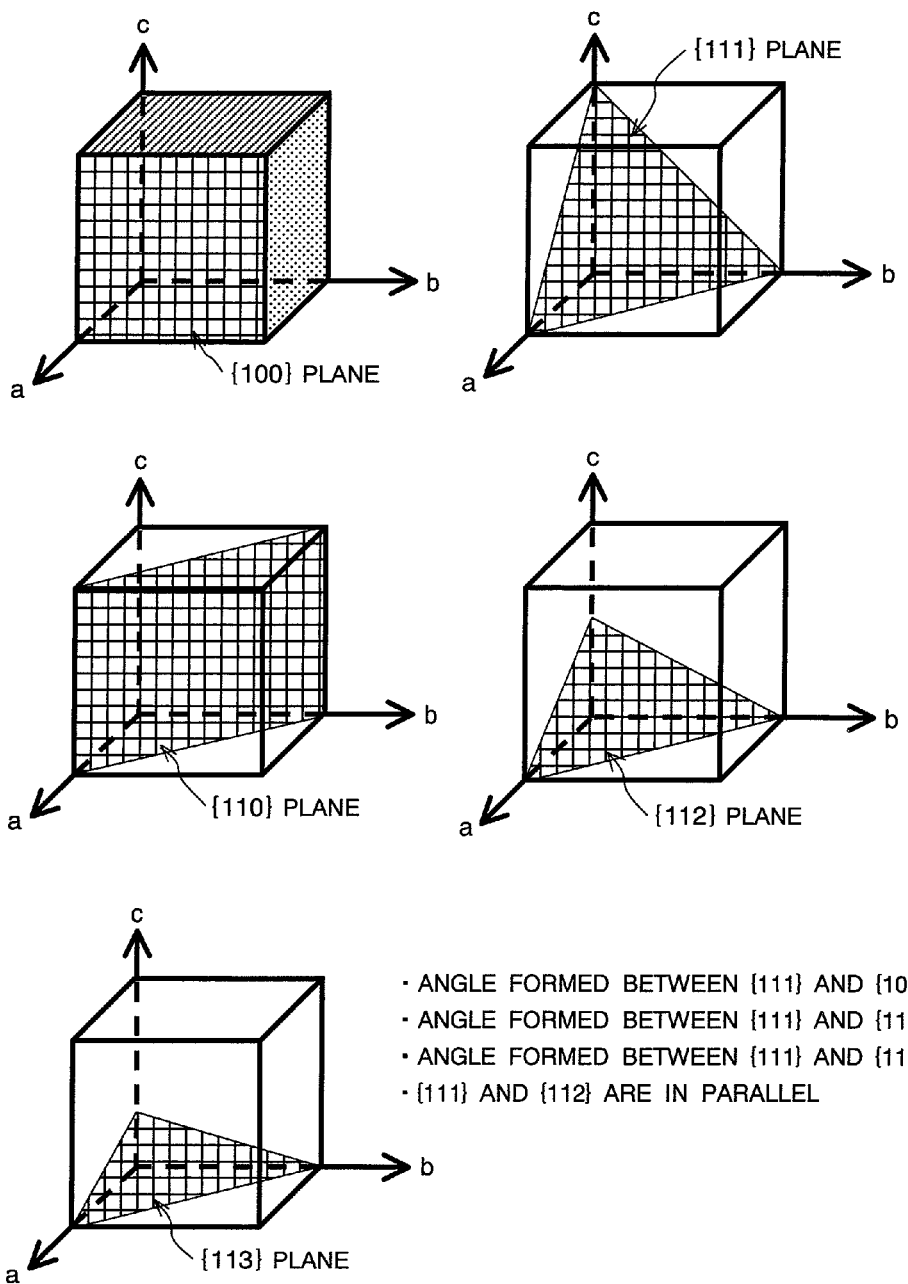
FIG. 1 is a schematic illustration showing major crystal planes of a copper crystal.

FIG. 1 shows a schematic illustration showing major crystal planes of a copper crystal concerned with the invention. Since the copper crystal structure is a cubic structure, each of crystal planes and the plane direction are in the following relations.

Angle formed between $\{111\}_{Cu}$ and $\{100\}_{Cu}$ planes is 55°;

Angle formed between $\{111\}_{Cu}$ and $\{110\}_{Cu}$ planes is 35°;

Angle formed between $\{111\}_{Cu}$ and $\{112\}_{Cu}$ planes is 90°;

$\{111\}_{Cu}$ plane and $<112>_{Cu}$ direction are in parallel.

Here, { } represents the plane and < > represents the plane direction.

Figure 2:
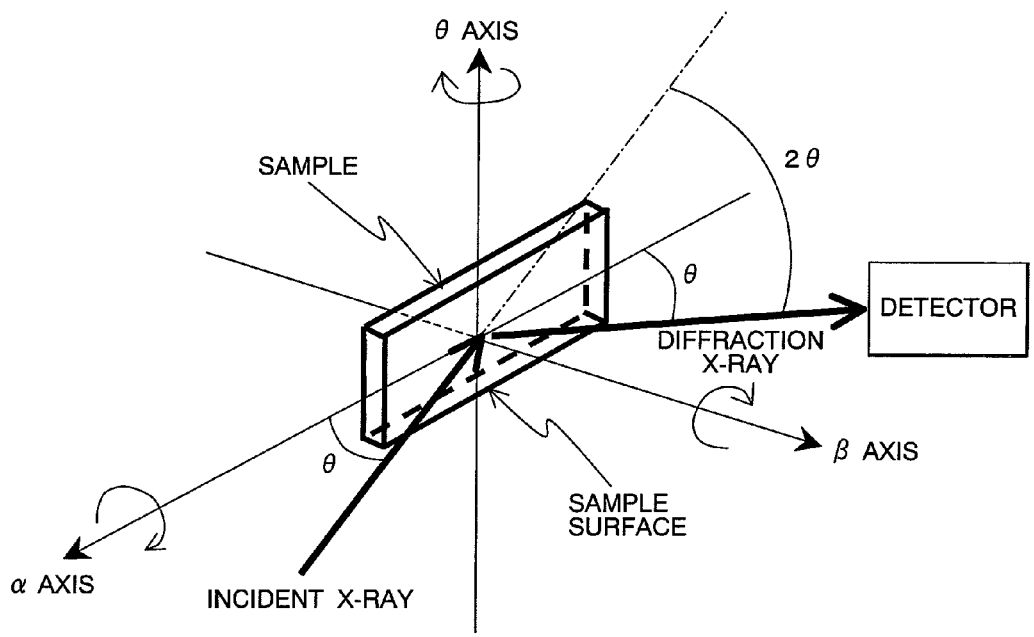
FIG. 2 is a schematic illustration showing a relationship among an incident X-ray, a detector, a sample, and a scanning axis in an X-ray diffractometer.

FIG. 2 is a schematic illustration showing a relationship among an incident X-ray, a detector, a sample, and a scanning axis in X-ray diffractmeter. Making reference to FIG. 2, an evaluation (measurement) method for a state of the crystal grain alignment of a rolled copper foil by X-ray diffraction (XRD) is to be described. Here, three scanning axis shown in FIG. 2 are generally referred to as a sample axis for the θ axis, a deflection axis for the α axis, and an in-plane rotation axis for the β axis. Further, the X-ray diffraction in the invention is always conducted by using the CuKα ray.

In an XRD 2θ/θ measurement, a sample and a detector are scanned by the θ axis, wherein a scanning angle of the sample is θ and that of the detector is 2θ. According to the 2θ/θ measurement, it can be estimated which crystal plane is a predominant plane at the surface (rolled surface) of a polycrystalline rolled copper foil. In other words, an occupation ratio of the plane at the rolled surface can be evaluated.

In an XRD rocking curve measurement, only a sample is scanned by the θ axis, while a detector is fixed at the scanning angle of 2θ value of a certain plane $\{hkl\}_{Cu}$. According to the rocking curve measurement, the orientation grade of the $\{hkl\}_{Cu}$ plane in the normal direction to the rolled surface can be estimated by a full width at half maximum ($FWHM_{\{hkl\}}$) or an integration width ($IW_{\{hkl\}}$) of the $\{hkl\}_{Cu}$ plane diffraction peak. The value of full width at half maximum ($FWHM_{\{hkl\}}$) or integration width ($IW_{\{hkl\}}$) is smaller, it means that the $\{hkl\}_{Cu}$ plane is more highly oriented in the normal direction to the rolled surface. In other words, since the copper crystal is a cubic structure, it can be considered that the full width at half maximum ($FWHM_{\{hkl\}}$) or the integration width ($IW_{\{hkl\}}$) represents the variation for a slant of the cube in the normal direction to the rolled surface. Here, it is defined that the full width at half maximum ($FWHM_{\{hkl\}}$) is a peak width at a half of the diffraction peak intensity and the integration width ($IW_{\{hkl\}}$) is a value of the integration intensity of the diffraction peak divided by the maximum intensity of the peak.

In an XRD pole figure measurement, while a detector is fixed at the scanning angle of 2θ value of α certain plane $\{hkl\}_{Cu}$, a sample is scanned stepwise by the α-axis and is rotated in-plane (in-plane rotation of 0° to 360°) by the β-axis for each of α-values. According to the pole figure measurement, both of the extent of a slant and a direction of the noted $\{hkl\}_{Cu}$ plane from the normal direction to the rolled surface can be estimated.

In the XRD pole figure measurement of the invention, the normal direction to the sample surface is defined as α=90° to be a reference for the measurement. Further, while the pole figure measurement includes a reflection method (α=15° to 90°) and a transmission method (α=0° to 15°), only the reflection method (α=15° to 90°) of the pole figure measurement is conducted in this invention.

One of the XRD measuring methods utilizing the feature of the pole figure measurement is an in-plane alignment measurement. In the in-plane alignment measurement, while a detector is fixed at the scanning angle of 2θ value of the $\{h'k'l'\}_{Cu}$ plane that is geometrically correlated with the noted $\{hkl\}_{Cu}$ plane, a sample is tilted to the scanning angle α (α=90°–α') by the α-axis and is rotated in-plane (in-plane rotation of 0° to 360°), wherein α' is an angle formed between the $\{h'k'l'\}_{Cu}$ and the $\{hkl\}_{Cu}$ planes. According to the in-plane alignment measurement, with a full width at half maximum ($FWHM_{\{h'k'l'\}}$) or an integration width ($IW_{\{h'k'l'\}}$) of the $\{h'k'l'\}_{Cu}$ plane diffraction peak, the orientation grade of the $\{h'k'l'\}_{Cu}$ plane in the two-axis direction within the rolled surface can be estimated. The value of full width at half maximum (($FWHM_{\{h'k'l'\}}$) or integration width ($IW_{\{h'k'l'\}}$) is smaller, it means that the crystal grains are more highly oriented in the in-plane direction of the rolled surface. In other words, it can be considered that the full width at half maximum ($FWHM_{\{h'k'l'\}}$) or the integration width ($IW_{\{h'k'l'\}}$) represents the variation in the rotation of the cube within the rolled surface (deviation from "grid"). In the same manner as described above, it is defined that the full width at half maximum ($FWHM_{\{h'k'l'\}}$) is a peak width at a half of the diffraction peak intensity and the integration width ($IW_{\{h'k'l'\}}$) is a value of the integration intensity of the diffraction peak divided by the maximum intensity of the peak.

First Embodiment of the Invention

Ratio of Normalized Average Intensity

A rolled copper foil of this embodiment has a feature that a rolled copper foil is applied with a recrystallization annealing after a final cold rolling step, and that a crystal grain alignment thereof satisfies a ratio of [a]/[b]≧3 where [a] and [b] are normalized average intensities of a $\{111\}_{Cu}$ plane diffraction of a copper crystal by β-scanning at α=35° and 74°, respectively, in an XRD pole figure measurement to a rolled surface.

The normalized average intensity $R_c$ means herein a number of counts averaging a diffraction intensity of a predetermined $\{hkl\}_{Cu}$ plane by β-axis scanning (in-plane rotation axis scanning) at respective angles α in the XRD pole figure measurement, which can be calculated according to the following equation (refer to the following literature for the details). Normalizing calculation is usually conducted by a computer.

$$R_c = I_c / I_{std}$$

in which $I_c$: corrected intensity (background correction, absorption correction)

$I_{std}$: intensity for normalization determined by calculation.

(Document's Name) "RAD system, Application software, Texture analysis program handling manual (manual No. MJ201RE)" Rigaku Corp., pp. 22-23.

(Document's Name) "CN9258E101, RINT 2000 Series, Application software, Pole figure program handling manual (Manual No. MJ11002A01)" Rigaku Corp., pp. 8-10.

The diffraction intensity is used by normalization, so that comparison of samples can be made while eliminating effects due to the difference of condition setting such as a tube voltage or a tube current upon the XRD measurement (no substantial apparatus dependence).

On the other hand, the normalized average intensity of the $\{111\}_{Cu}$ plane diffraction at α=35° [a] and that at α=74° [b] in the XRD pole figure measurement of the copper crystal grains have the following meanings respectively.

When a recrystallization annealing is applied to a rolled copper foil, a $\{200\}_{Cu}$ plane is predominant at the rolled surface of the copper foil. Since the angle between a $\{111\}_{Cu}$ and the $\{200\}_{Cu}$ planes is geometrically 55°, α=35° (=90°−55°). Therefore, it can be considered that the normalized average intensity [a] is a diffraction intensity of the $\{111\}_{Cu}$ plane corresponding to the $\{200\}_{Cu}$ plane at the rolled surface. In other words, that means indirectly a normalized diffraction intensity of the $\{200\}_{Cu}$ plane at the rolled surface.

Since the $\{200\}_{Cu}$ and the $\{100\}_{Cu}$ planes are in parallel, the angle formed between the $\{200\}_{Cu}$ and the $\{111\}_{Cu}$ planes is naturally 55° (refer to FIG. 1).

In the same manner, since the angle formed between the rolled surface and a $\{111\}_{Cu}$ plane to the twin region of the $\{200\}_{Cu}$ plane at the rolled surface is geometrically 16°, α=74° (=90°−16°). Therefore, it can be considered that the normalized average intensity [b] is a diffraction intensity of the $\{111\}_{Cu}$ plane corresponding to the twin region of the $\{200\}_{Cu}$ plane at the rolled surface. In other words, that means indirectly a normalized diffraction intensity of the twin region corresponding to the $\{200\}_{Cu}$ plane at the rolled surface.

Accordingly, [a]/[b] means a ratio of a normalized diffraction intensity between the $\{200\}_{Cu}$ plane as the cubic texture and the twin region thereof at the rolled surface.

Figure 3:
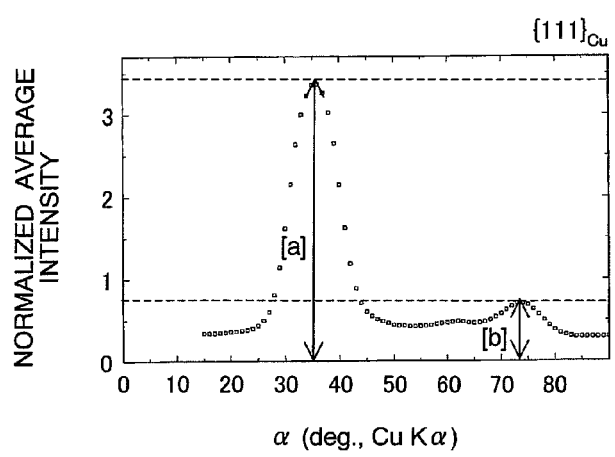
FIG. 3 is an example of a normalized average intensity of the $\{111\}_{Cu}$ plane diffraction as a function of α angle by an XRD pole figure measurement to a rolled surface on a rolled copper foil applying a recrystallization annealing after a final cold rolling step in a preferred embodiment according to the invention.

FIG. 3 shows an example of the normalized average intensity of the $\{111\}_{Cu}$ plane diffraction as a function of α angle by the XRD pole figure measurement to the rolled surface on the rolled copper foil applying a recrystallization annealing after a final cold rolling step in a preferred embodiment according to the invention. As shown in FIG. 3, the ratio between the normalized average intensity at α=35° [a] and that at α=74° [b] of the $\{111\}_{Cu}$ plane diffraction is [a]/[b]≧3. This result shows that a rolled copper foil of the present invention has less twin texture (twin region) of the $\{200\}_{Cu}$ plane in the cubic texture mainly comprising the $\{200\}_{Cu}$ plane.

On the other hand, in a case where the ratio of the normalized average intensity of the $\{111\}_{Cu}$ plane diffraction is [a]/[b]<3, no higher flexible fatigue property than usual can be obtained. Accordingly, the crystal grain alignment of the rolled copper foil satisfies [a]/[b]≧3, preferably [a]/[b]≧3.5, and more preferably [a]/[b]≧4.

Second Embodiment of the Invention

In-Plane Alignment Measurement

The rolled copper foil in this embodiment has a feature that an average of full width at half maximum of diffraction peaks (ave–$FWHM_{\{111\}}$) of the $\{111\}_{Cu}$ plane in geometrical correlation with the $\{200\}_{Cu}$ plane of the rolled surface is 100 or less in the XRD in-plane alignment measurement, wherein the $\{111\}_{Cu}$ plane is in a geometrical relation of 55° with the $\{200\}_{Cu}$ plane of a cubic texture, in addition to a first embodiment of the invention.

Figure 4:
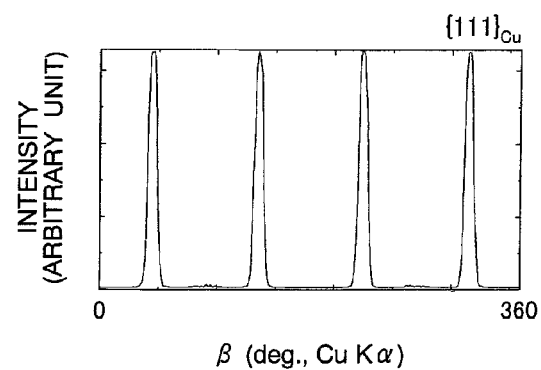
FIG. 4 is an example of a diffraction pattern indicating an in-plane alignment of the $\{111\}_{Cu}$ plane, which is in a geometrical relation of 55° (α=35° of measuring condition) to the $\{200\}_{Cu}$ plane, by an XRD pole figure measurement to a rolled surface on a rolled copper foil applying a recrystallization annealing after a final cold rolling step in a preferred embodiment according to the invention.

FIG. 4 shows an example of a diffraction pattern indicating an in-plane alignment of the $\{111\}_{Cu}$ plane, which is in a geometrical relation of 55° (α=35° of measuring condition) to the $\{200\}_{Cu}$ plane, by the XRD in-plane alignment measurement to a rolled surface on a rolled copper foil applying a recrystallization annealing after a final cold rolling step in a preferred embodiment according to the invention. As shown in FIG. 4, four diffraction peaks, i.e., fourfold symmetric peaks can be recognized (setting the rolling direction as β≈0°, respective peaks appear, e.g., at β≈45°, 135°, 225° and 315°). In a case where the cubic texture is developed (e.g., when the $\{200\}_{Cu}$ plane of the recrystallized grains occupies about 90% or more of the diffraction peaks at the rolled surface), an extra peak other than the fourfold symmetry peaks is scarcely detected in the β-scanning. Further, an average of full width at half maximum of the $\{111\}_{Cu}$ plane diffraction peaks (ave–$FWHM_{\{111\}}$) according to the in-plane orientation measurement is 10° or less (average of the four peaks). This result shows that a rolled copper foil of the present invention has the $\{111\}_{Cu}$ plane highly in-plane aligned along the rolled surface.

On the other hand, in a case where the ave–$FWHM_{\{111\}}$ of the $\{111\}_{Cu}$ plane diffraction exceeds 10°, no higher flexible fatigue property than usual can be obtained. Accordingly, the ave–$FWHM_{\{111\}}$) of the rolled copper foil satisfies 10° or less, preferably 9.5° or less, and more preferably 9° or less.

Third Embodiment of the Invention

2θ/θ Measurement

The rolled copper foil in this embodiment has a feature that 90% or more of diffraction peak of a copper crystal is the $\{200\}_{Cu}$ plane diffraction in the XRD 2θ/θ measurement, in addition to a first embodiment of the invention.

Figure 5:
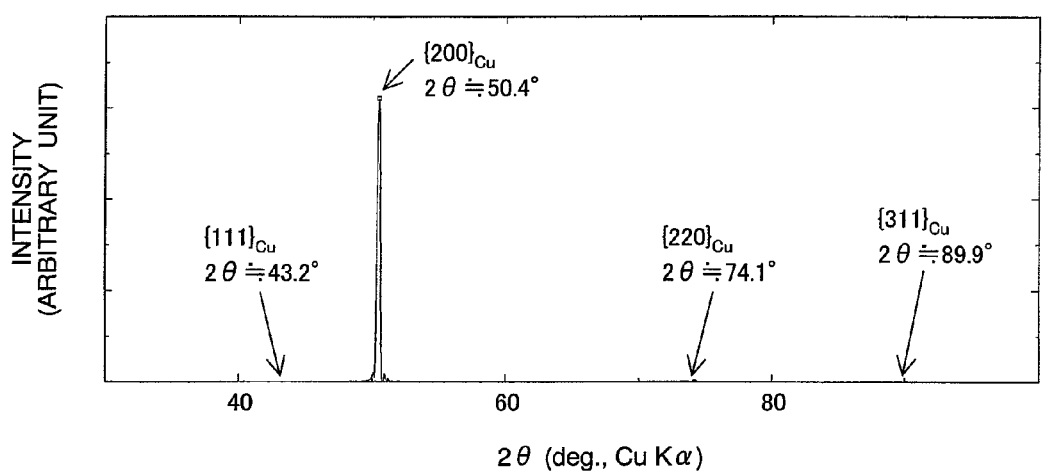
FIG. 5 is an example of a diffraction pattern by an X-ray diffraction 2θ/θ measurement to a rolled surface on a rolled copper foil applying a recrystallization annealing after a final cold rolling step in a preferred embodiment according to the invention.

FIG. 5 shows an example of a diffraction pattern by the XRD 2θ/θ measurement to the rolled surface on the rolled copper foil applying a recrystallization annealing after a final cold rolling step in a preferred embodiment according to the invention. As shown in FIG. 5, the rolled surface is strongly oriented to the $\{200\}_{Cu}$ plane of the recrystallized grains and the occupation ratio of the $\{200\}_{Cu}$ plane thereof is 90% or more. This result shows that the rolled copper foil has a well-developed cubic texture.

On the other hand, in a case where the occupation ratio of the $\{200\}_{Cu}$ plane diffraction among the diffraction peaks is less than 90%, no higher flexible fatigue property than usual can be obtained. Accordingly, the rolled copper foil satisfies that the occupation ratio of the $\{200\}_{Cu}$ plane thereof is 90% or more, preferably 92% or more, and more preferably 94% or more.

Here, the occupation ratio of the $\{200\}_{Cu}$ plane is defined as below:

Occupation ratio of $\{200\}_{Cu}$ plane (%)=[$I_{\{200\}Cu}$/
$\{I_{\{111\}Cu}+I_{\{200\}Cu}+I_{\{220\}Cu}+I_{\{311\}Cu}\}$]×100 in which $I_{\{200\}Cu}$: diffraction peak intensity of $\{200\}_{Cu}$ plane;

$I_{\{111\}Cu}$: diffraction peak intensity of $\{111\}_{Cu}$ plane;

$I_{\{220\}Cu}$: diffraction peak intensity of $\{220\}_{Cu}$ plane;

$I_{\{311\}Cu}$: diffraction peak intensity of $\{311\}_{Cu}$ plane.

[Rocking Curve Measurement]

In addition to the above feature, the rolled copper foil in this embodiment has another feature that the full width at half maximum of the $\{200\}_{Cu}$ plane diffraction peak ($FWHM_{\{200\}}$) is 10° or less in the XRD rocking curve measurement.

Figure 6:
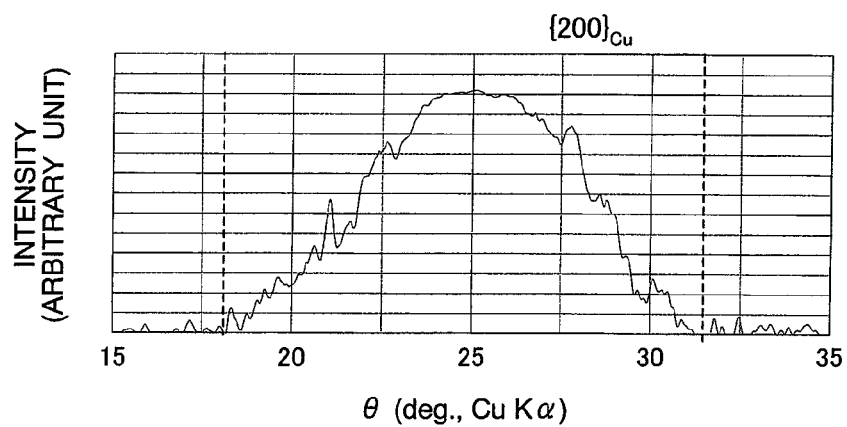
FIG. 6 is an example of a diffraction pattern of the $\{200\}_{Cu}$ plane by an XRD rocking curve measurement to a rolled surface on a rolled copper foil applying a recrystallization annealing after a final cold rolling step in a preferred embodiment according to the invention.

The present invention takes notice not only on the occupation ratio of the $\{200\}_{Cu}$ plane, but also on the crystal orientation grade of the $\{200\}_{Cu}$ plane in the recrystallized grains of the rolled copper foil. FIG. 6 shows an example of a diffraction pattern of the $\{200\}_{Cu}$ plane by the XRD rocking curve measurement to the rolled surface on a rolled copper foil applying a recrystallization annealing after a final cold rolling step in a preferred embodiment according to the invention. As shown in FIG. 6, the full width at half maximum of the $\{200\}_{Cu}$ plane diffraction peak ($FWHM_{\{200\}}$) by the XRD rocking curve measurement is 10° or less. This result shows that a rolled copper foil of the present invention has the $\{200\}_{Cu}$ plane strongly oriented in the normal direction to the rolled surface (having good crystal orientation).

On the other hand, in a case where $FWHM_{\{200\}}$ of the $\{200\}_{Cu}$ plane diffraction exceeds 10°, no higher flexible fatigue property than usual can be obtained. Accordingly, $FWHM_{\{200\}}$ at the rolled surface of the rolled copper foil satisfies 10° or less, preferably 9.5° or less, and more preferably 9° or less.

Fourth Embodiment of the Invention

Rocking Curve Measurement

The rolled copper foil in this embodiment has a feature that a ratio between the full width at half maximum ($FWHM_{\{200\}}$) and the integration width ($IW_{\{200\}}$) is $0.85 \leq IW_{\{200\}}/FWHM_{\{200\}} \leq 1.15$ in the XRD rocking curve measurement of the $\{200\}_{Cu}$ plane oriented intensely to the rolled surface, in addition to a first embodiment of the invention.

The present invention takes notice on a ratio between the full width at half maximum ($FWHM_{\{200\}}$) and the integration width ($IW_{\{200\}}$), as a grade of the $\{200\}_{Cu}$ plane orientation described above. It means that $FWHM_{\{200\}}$ and $IW_{\{200\}}$ have almost the same values, in a case where the ratio between the full width at half maximum ($FWHM_{\{200\}}$) and the integration width ($IW_{\{200\}}$) is 0.85 or more and 1.15 or less. Accordingly, it is strongly suggested that the diffraction peak has a less trailing shape and that the ratio of the small angle tilt grains (with less fluctuation range for the crystal orientation) is high in the normal direction to the rolled surface. For example, as the shape of the diffraction peak approaches a trapezoidal or a rectangular form, the ratio between $FWHM_{\{200\}}$ and $IW_{\{200\}}$ ($IW_{\{200\}}/FWHM_{\{200\}}$) approaches 1.

On the other hand, in a case where the ratio between $FWHM_{\{200\}}$ and $IW_{\{200\}}$ ($IW_{\{200\}}/FWHM_{\{200\}}$) is less than 0.85, or exceeds 1.15, no higher flexible fatigue property than usual can be obtained. Accordingly, $IW_{\{200\}}/FWHM_{\{200\}}$) at the rolled surface of the rolled copper foil satisfies 0.85 or more and 1.15 or less, preferably 0.9 or more and 1.1 or less. From a view point of the crystal grain alignment, it is consequent that a smaller value is more preferred for $FWHM_{\{200\}}$ and $IW_{\{200\}}$.

(In-Plane Alignment Measurement)

In addition to the above feature, the rolled copper foil in this embodiment has another feature that a ratio between the full width at half maximum ($FWHM_{\{111\}}$) and the integration width ($IW_{\{111\}}$) among the fourfold symmetric diffraction peaks of the $\{111\}_{Cu}$ plane in the XRD in-plane alignment measurement is $0.85 \leq IW_{\{111\}}/FWHM_{\{111\}} \leq 1.15$, wherein the $\{111\}_{Cu}$ plane is in a geometrical relation of 55° to the $\{200\}_{Cu}$ plane of the rolled surface.

The present invention takes notice also on a ratio between the full width at half maximum ($FWHM_{\{111\}}$) and the integration width ($IW_{\{111\}}$), as a grade of the in-plane alignment of the $\{111\}_{Cu}$ plane described above. Since the recrystallized grains of the rolled surface are highly oriented to the $\{200\}_{Cu}$ plane, when the $\{111\}_{Cu}$ plane diffraction is measured by the XRD in-plane alignment measurement, only the fourfold symmetric peaks can be recognized (setting the rolling direction as β≈0°, respective peaks appear, e.g., β≈45°, 135°, 225°, and 315°; refer to FIG. 3). As described above, in a case where the $\{200\}_{Cu}$ plane of the recrystallized grains occupies about 90% or more of the diffraction peaks at the rolled surface, an extra peak other than the fourfold symmetry peaks is scarcely detected in the β-scanning.

Further, it means that $FWHM_{\{111\}}$ and $IW_{\{111\}}$ have almost the same values, in a case where the ratio between the full width at half maximum ($FWHM_{\{111\}}$) and the integration width ($IW_{\{111\}}$) is 0.85 or more and 1.15 or less. Accordingly, it is strongly suggested that the diffraction peak has a less trailing shape and that the ratio of the small angle tilt grains (with less fluctuation range for the crystal orientation) is high in-plane of the rolled surface. For example, as the shape of the diffraction peak approaches a trapezoidal or a rectangular form, the ratio between $FWHM_{\{111\}}$ and $IW_{\{111\}}$ ($IW_{\{111\}}/FWHM_{\{111\}}$) approaches 1.

On the other hand, in a case where the ratio between $FWHM_{\{111\}}$ and $IW_{\{111\}}$ ($IW_{\{111\}}/FWHM_{\{111\}}$) is less than 0.85, or exceeds 1.15, no higher flexible fatigue property than usual can be obtained. Accordingly, $IW_{\{111\}}/FWHM_{\{111\}}$ of the rolled copper foil satisfies 0.85 or more and 1.15 or less, preferably 0.9 or more and 1.1 or less. From a view point of the crystal grain alignment, it is consequent that a smaller value is more preferred for $FWHM_{\{111\}}$ and $IW_{\{111\}}$.

Aforementioned crystal grain alignment of the rolled copper foil is to be summarized. In the rolled copper foil according to the above embodiments of the present invention, it is clarified that a cubic texture is formed in which the occupation ratio of the $\{200\}_{Cu}$ plane at the rolled surface is 90% or more, that the twin region of the $\{200\}_{Cu}$ plane is very small, that the $\{200\}_{Cu}$ plane is highly oriented in the normal direction to the rolled surface, that the fluctuation range for the crystal orientation of the $\{200\}_{Cu}$ plane is small, that the $\{111\}_{Cu}$ plane has a good in-plane alignment, and that the fluctuation range for the crystal alignment of the $\{111\}_{Cu}$ plane is small. These features strongly suggest that the cubic copper crystals of the polycrystalline rolled copper foil of the invention are strongly aligned in a three-dimensional manner.

(Mechanism of Improving Flexible Fatigue Property)

Then, the mechanism for improving the flexible fatigue property of the rolled copper foil in a preferred embodiment according to the invention is to be described.

When a stress is applied on metal crystals, dislocations tend to move along the slip plane of the crystals. However, a crystal grain boundary generally plays a barrier to the movement of the dislocation. In a polycrystalline rolled copper foil, when dislocations are concentrated to the grain boundary, etc. due to bending motion, it is considered that a crack formation will be occurred at the concentrated portion to cause so-called metal fatigue. In other words, it is expected that the flexible fatigue property can be improved in the polycrystalline body if the concentration of the dislocations can be suppressed.

As described above, since the rolled copper foil in a preferred embodiment according to the invention has a texture in which the cubic crystals of the copper are highly aligned in the three-dimensional manner, it is considered that the alternate-slip of the dislocations will be occurred at a high probability consequent on bending. Thus, it is considered that the grain boundary, etc. less plays a barrier to the movement of the dislocation resulting in the improvement of the flexible fatigue property (making the flexible fatigue life longer).

Specifically, in order to occur the alternate-slip of the dislocation effectively, it is necessary in the cubic texture mainly comprising the $\{200\}_{Cu}$ plane that at least both of ave-$FWHM_{\{111\}}$ and $FWHM_{\{200\}}$ are excellent (small), which means excellent in the three-axis orientation (e.g., ave-$FWHM_{\{111\}} \leq 10°$ and $FWHM_{\{200\}} \leq 10°$).

This is because the alternate-slip is less occurred due to a different slipping direction between the adjacent grains unless the ave-$FWHM_{\{111\}}$ is smaller, even when a so-called cubic texture is developed (this generally means a state in which only the occupation ratio of the $\{200\}_{Cu}$ plane at the rolled surface is high). Furthermore, even if the alternate-slip is partially occurred, the different slipping direction leads cracks at the boundary of the adjacent grains.

Further, it is preferred that the fluctuation range of the $\{200\}_{Cu}$ plane is small and that of the $\{111\}_{Cu}$ plane is small (e.g., "$0.85 \leq IW_{\{200\}}/FWHM_{\{200\}} \leq 1.15$" and "$0.85 \leq IW_{\{111\}}/FWHM_{\{111\}} \leq 1.15$") in order to occur the alternate-slip of the dislocation effectively. This is because the slipping direction tends to be different between the adjacent grains and the alternate-slip is less occurred in a case where the fluctuation range for the $\{200\}_{Cu}$ plane or the $\{111\}_{Cu}$ plane is not small.

Further, in addition to the three-axis orientation of the cubic texture, it is also an important factor that the rolled copper foil has less twin region of the $\{200\}_{Cu}$ plane (e.g., [a]/[b]≧3). This is because the slipping directions for respective planes are naturally different since the $\{200\}_{Cu}$ plane at the rolled surface and the twin region thereof are not in parallel relation, as a result the twin boundary often plays a barrier to the movement of the dislocation.

Fifth Embodiment of the Invention

Average Grain Size of Recrystallized Grains in Rolled Copper Foil

The rolled copper foil in this embodiment has a feature that an average grain size of the recrystallized grains observed on the rolled surface is 40 μm or more, in addition to a first embodiment of the invention.

As described above, in the polycrystalline rolled copper foil, improvement of the flexible fatigue property is expected in a case where the concentration of the dislocations (or barrier to the movement of the dislocations) can be suppressed. Therefore, the effect of improving the flexible fatigue property is more remarkable by means of enlarging the grain size of recrystallized grains (reducing the grain boundary) in addition to a crystal structure with good alignment of the copper cubic crystals in a three-dimensional manner and with less twin region of the $\{200\}_{Cu}$ plane.

However, if the three-axis alignment of the recrystallized grains is inadequate for example, the effect of improving the flexible fatigue property is small even when the grain boundary is merely reduced. Therefore, it is also necessary that the rolled copper foil in this embodiment has such a crystal grain alignment that causes the alternate-slip of the dislocation during bending. Further, the average grain size of the recrystallized grains of 40 μm or more can be obtained by making the total working ratio in the final cold rolling step larger (e.g., 94% or more) and, while by suppressing the recrystallization phenomenon in the course of the cold rolling (details will be described later).

On the other hand, in a case where the average grain size of recrystallized grains is less than 40 μm, no higher flexible fatigue property than usual can be obtained. Accordingly, the rolled copper foil satisfies the average grain size of the recrystallized grains of 40 μm or more, preferably 50 μm or more, and more preferably 60 μm or more.

Sixth Embodiment of the Invention

Normalized Average Intensity

A rolled copper foil in this embodiment has a feature that a rolled copper foil is in a state after a final cold rolling step and before a recrystallization annealing, and that the normalized average intensity of the $\{111\}_{Cu}$ plane diffraction as a function of α angle is not a stepwise form, or has substantially only by one maximal range in a range of the angle α of 35° to 75° in the XRD pole figure measurement to the rolled surface.

Figure 7:
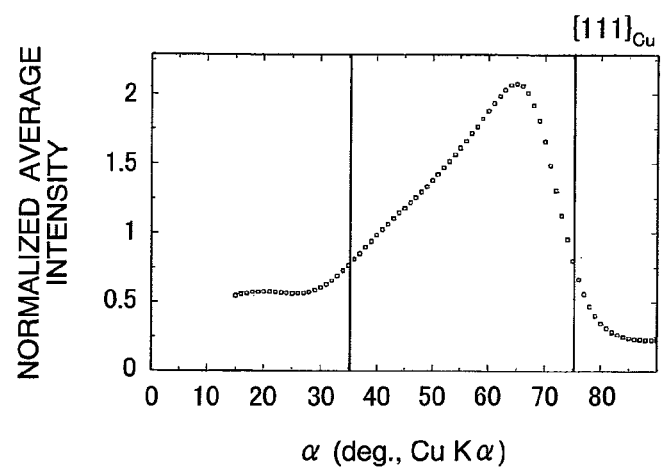
FIG. 7 is an example of a normalized average intensity of the $\{111\}_{Cu}$ plane diffraction as a function of α angle by an XRD pole figure measurement to a rolled surface on a rolled copper foil after a final cold rolling step and before a recrystallization annealing in a preferred embodiment according to the invention.

FIG. 7 shows an example of a normalized average intensity of the $\{111\}_{Cu}$ plane diffraction as a function of α angle by the XRD pole figure measurement to a rolled surface on a rolled copper foil after a final cold rolling step and before a recrystallization annealing in a preferred embodiment according to the invention. As shown in FIG. 7, it is shown that the normalized average intensity of the $\{111\}_{Cu}$ plane diffraction is not a stepwise form or has substantially only by one maximal region within a range of α=35° to 75°.

On the other hand, in a case where the normalized average intensity of the $\{111\}_{Cu}$ plane diffraction as a function of α angle is a stepwise form or has plural maximal regions within a range of α=35° to 75°, the ratio of the normalized average intensities described above becomes [a]/[b]<3 after applying the recrystallization annealing and no higher flexible fatigue property than usual can be obtained. Accordingly, the normalized average intensity of the $\{111\}_{Cu}$ plane diffraction of the rolled copper foil with high flexible fatigue property is not a stepwise form or has substantially only by one maximal region within a range of α=35° to 75°.

Seventh Embodiment of the Invention

2θ/θ Measurement

The rolled copper foil in this embodiment has a feature that 80% or more of diffraction peaks of a copper crystal is the $\{220\}_{Cu}$ plane diffraction in the XRD 2θ/θ measurement to the rolled surface, in addition to a sixth embodiment of the invention.

Figure 8:
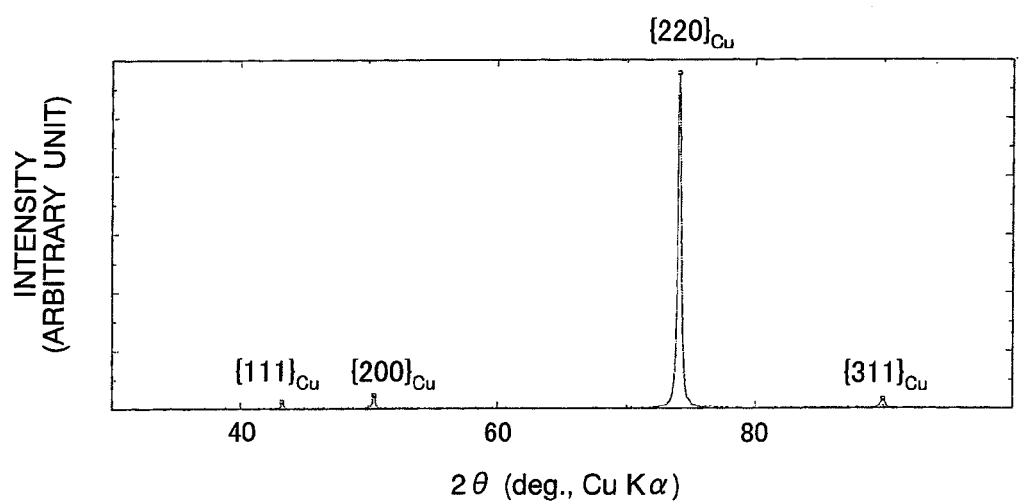
FIG. 8 is an example of a diffraction pattern by an X-ray diffraction 2θ/θ measurement to a rolled surface on a rolled copper foil after a final cold rolling step and before a recrystallization annealing in a preferred embodiment according to the invention.

FIG. 8 shows an example of a diffraction pattern by the XRD 2θ/θ measurement to the rolled surface on a rolled copper foil after a final cold rolling step and before a recrystallization annealing in a preferred embodiment according to the invention. As shown in FIG. 8, the rolled surface is strongly oriented to the $\{220\}_{Cu}$ plane and the occupation ratio of the $\{220\}_{Cu}$ plane thereof is 80% or more. This result shows that the rolled copper foil has a preferred rolled texture.

On the other hand, in a case where the occupation ratio of the $\{220\}_{Cu}$ plane is less than 80%, no higher flexible fatigue property than usual can be obtained in the rolled copper foil subsequently applied with the recrystallization annealing. Accordingly, the rolled copper foil satisfies that the occupation ratio of the $\{220\}_{Cu}$ plane thereof 80% or more, preferably 85% or more, and more preferably 90% or more.

The occupation ratio of the $\{220\}_{Cu}$ plane is defined as below.

Occupation ratio of $\{220\}_{Cu}$ plane (%)=[$I_{\{220\}Cu}$/($I_{\{111\}Cu}+I_{\{200\}Cu}+I_{\{220\}Cu}+I_{\{311\}Cu}$)]×100

Eighth Embodiment of the Invention

Copper Alloy Composition of Rolled Copper Foil

The rolled copper foil for FPC in this embodiment has a feature that a copper alloy comprising 0.001 to 0.009 mass % of Sn, the balance consisting of Cu and an inevitable impurity is used.

The reasons for adding the alloy elements to compose the copper alloy material of the rolled copper foil and for limiting the content thereof are as follows.

For the rolled copper foil, as the total working ratio in the final cold rolling step is larger (e.g., 90% or more), it tends to cause the natural softening (cold softening). In a case where the undesired phenomenon (cold softening) occurs, deformation of a copper foil arises easily during cutting of the copper foil or laminating with a base material in the FPC manufacturing step, and the production yield of FPC will be lowered.

The Sn addition to the Cu has an effect to suppress the cold softening phenomenon (to control the softening temperature or the recrystallization starting temperature) even though a strong working is applied in the final cold rolling step. "Cold softening" includes herein a partial recrystallization phenomenon during the cold rolling (details are to be described later).

The softening temperature of the rolled copper foil increases with increasing the Sn content. In a case where the Sn content is less than 0.001 mass %, it is difficult to control the softening temperature to be desired. Further, in a case where the Sn content is more than 0.009 mass %, the softening temperature is excessively high making the recrystallization annealing in aforementioned CCL step to be difficult and also it causes a disadvantage of lowering the electrical conductivity.

Accordingly, the Sn content of the copper alloy for the rolled copper foil is defined as 0.001 to 0.009 mass %, preferably 0.002 to 0.008 mass %, and more preferably 0.003 to 0.007 mass %.

(Manufacturing Method of Rolled Copper Foil)

FIG. 9 shows a flowchart showing steps of manufacturing a rolled copper foil in a preferred embodiment according to the invention. The rolled copper foil of the present invention can be made as follows. After preparing an ingot (cast ingot) made of a tough pitch copper (JIS H3100 C1100), an oxygen-free copper (JIS H3100 C1020), or the copper alloy described above as a starting material (step a), a hot rolling step that the cast ingot thus formed is hot-rolled (step b) is conducted; after the hot rolling step, a cold rolling step that the hot-rolled plate thus formed is cold-rolled (step c) and a process annealing step that the work hardening by the cold rolling is relaxed (step d) are conducted, where steps c and d are properly repeated, to produce a rolled copper sheet just before a final cold rolling step referred to as "green sheet". The process annealing step just before the final cold rolling step is sometimes referred to as "annealing step for green sheet" (step d'). In the "annealing step for green sheet", it is desired that the previous working strain is relaxed sufficiently (e.g., almost full annealing).

Then, a final cold rolling step (step e, also sometimes referred to as "finish rolling step") is applied to "green sheet" to produce a rolled copper foil of a predetermined thickness for FPC. The rolled copper foil in this stage is in a work-hardened state (not annealed state).

The rolled copper foil after the final cold rolling step is applied optionally with a surface treatment, etc. (step f), and supplied to an FPC manufacturing step (step g). As mentioned before, the recrystallization annealing (step g') is often conducted during the step g (e.g., CCL step).

In the present invention, "final cold rolling step" means the step e, and "recrystallization annealing" step g' means the annealing conducted during the step g.

The manufacturing method of the rolled copper foil in the present invention has a feature that the total working ratio in the final cold rolling step before the recrystallization annealing is controlled to be 94% or more, and that the working ratio per one pass in the final cold rolling step is controlled to be 15 to 50%. Further, it has a feature to control such that "working ratio at first pass"≧"working ratio at second pass"≧"working ratio at third pass" and to control the working ratio per one pass at the third or more passes to be 15 to 25%.

The total working ratio is defined as:

"total working ratio (%)={1−(foil thickness after final cold rolling step/thickness of green sheet)}× 100".

Further, working ratio per one pass means the reduction ratio of the plate thickness upon passing between a pair of rolling rolls, and is defined as:

"working ratio per one pass (%)={1−(foil thickness after rolling for once/foil thickness before the rolling)}×100".

In the final cold rolling step before the recrystallization annealing, the total working ratio is defined as 94% or more, in order to develop the $\{220\}_{Cu}$ plane orientation (rolled texture) and to attain the $\{200\}_{Cu}$ plane orientation (cubic texture) having 90% or more occupation ratio at the rolled surface by the subsequent recrystallization annealing, as well as, in order to make the average grain size of the recrystallized grains to be 40 μm or more by the recrystallization annealing.

Further, in the final cold rolling step before the recrystallization annealing, the working ratio per one pass is controlled to be 15 to 50%, particularly, it is controlled such that "working ratio at first pass"≧"working ratio at second pass"≧"working ratio at third pass", as well as the working ratio at the third or more passes is controlled to be 15 to 25%, in order to achieve the crystal grain alignment in which the normalized average intensity of the $\{111\}_{Cu}$ plane diffraction is not a stepwise form, or has substantially only by one maximal region in a range of α=35° to 75° as a function of α angle by the XRD pole figure measurement to a rolled surface with the rolled texture.

In the final cold rolling step, in a case where the total working ratio is less than 94%, or the control of the working ratio per one pass is out of the condition described above, it is not sufficient for attaining the purpose. Accordingly, the total working ratio is defined as 94% or more and the working ratio per one pass is controlled to be 15 to 50%. Further, it is preferred to control such that "working ratio at first pass"≧"working ratio at second pass"≧"working ratio at third pass", as well as to control the working ratio at the third or more passes to be 15 to 25%.

[Discussion on Working Ratio Control]

It is considered that an applied stress to an object during rolling is separated into "tensile stress component" and "compressive stress component". Further, during the cold rolling to the copper foil, copper crystals in the copper foil cause a rotation phenomenon due to the applied stress to develop a rolled texture. Generally, in the case of the compressive stress the rotational direction of crystals due to the stress (orientation direction to the rolled surface) is the $\{220\}_{Cu}$ plane, and in the case of the tensile stress that is the $\{311\}_{Cu}$ plane or the $\{211\}_{Cu}$ plane.

In the conventional rolled copper foil, the total working ratio and the working ratio per one pass are set higher in the final cold rolling step and then the compressive stress to the foil is increased for developing the $\{220\}_{Cu}$ plane orientation (rolled texture).

Further, in the conventional rolled copper foil, only the total working ratio in the final cold rolling step is focused and no particular consideration is taken on the working ratio per one pass. In addition, from a view point of increasing the total working ratio, it is usually supposed that the working ratio per one pass is set higher to decrease the total number of working passes.

However, according to precise studies on the metal crystallography by the inventors, it has been found that a partial recrystallization phenomenon occurs in the course of the final cold rolling step as the total working ratio and the working ratio per one pass are set higher, and that the formation of the $\{220\}_{Cu}$ plane orientation (rolled texture) is inhibited. It is apparent that inhibition from the formation of the $\{220\}_{Cu}$ plane orientation (rolled texture) suppresses the three-axis alignment of the cubic texture after the recrystallization annealing (particularly, this deteriorates the normalized average intensity ratio "[a]/[b]" or the in-plane alignment "ave-FWHM$_{\{111\}}$" and "IW$_{\{111\}}$/FWHM$_{\{111\}}$").

Therefore in the present invention, it has been invented a manufacturing method of increasing the total working ratio (accumulated working strains) in the final cold rolling step while controlling the working ratio per one pass (compressive stress) to be lower, on the contrary to the prior art. This can achieve the $\{220\}_{Cu}$ plane orientation (rolled texture) having 80% or more of the occupation ratio while suppressing the partial recrystallization (relaxation of the working strain) in the course of the final cold rolling step.

Other Embodiments

In the step a, there are no restrictions on the melting and casting methods and also on the size of the starting materials. Also, there are no particular restrictions on the step b, step c, and the step d and usual methods and conditions may be employed. Further, the thickness of the rolled copper foil used for FPC is generally 50 μm or less and there are no particular restrictions also on the thickness of the rolled copper foil of the present invention so long as it is 50 μm or less.

[Manufacture of Flexible Printed Circuit]

A flexible printed circuit can be obtained by the conventional manufacturing method using the rolled copper foil of the preferred embodiments described above. Further, the recrystallization annealing to the rolled copper foil may be a heat treatment conducted in the usual CCL step or it may be conducted in a separated step.

Advantages of the Embodiments

The embodiments of the present invention have the following advantages:

(1) A rolled copper foil having more excellent flexible fatigue property than usual can be obtained.

(2) A rolled copper foil having more excellent flexible fatigue property than usual can be manufactured stably.

(3) Flexible wirings such as for flexible printed circuits (FPC) having more excellent flexible fatigue property than usual can be obtained.

(4) It can be applied not only to flexible printed circuits (FPC) but also other conductive members requiring high flexible fatigue property (flexible fatigue life), etc.

EXAMPLE

Examples of the invention will be described below, but the invention is not limited by these examples.

Manufacture of Example 1 and Comparative examples 1 to 3

At first, a cast ingot made of an oxygen-free copper (oxygen content: 2 ppm) with a thickness of 200 mm and a width of 650 mm is prepared as a starting material (step a). In accordance with the flow chart as shown in FIG. 9, the cast ingot is hot-rolled down to a thickness of 10 mm (step b). Then, conducting the cold rolling step (step c) and the process annealing step (step d) are properly repeated to prepare the green sheets having two kinds of thickness of 0.8 mm and 0.2 mm. For the annealing step for green sheet (step d'), the green sheets are held at a temperature of 700° C. for about 1 min.

Then, the green sheets are cold-rolled in the final cold rolling step (step e) under the conditions shown in Table 1, and then rolled copper foils with a thickness of 16 μm (Example 1 and Comparative examples 1 to 3) are manufactured. Specimens are manufactured each by five under each of the conditions (Table 1).

TABLE 1

Condition of final cold rolling step.

| | | Final cold rolling step (Green sheet → Copper foil of 16 μm thickness) | | |
|---|---|---|---|---|
| | Thickness of green sheet | Working ratio per one pass | Total working ratio | Total number of passes |
| Example 1 | 0.8 mm | First pass: about 50% Second pass: about 30% Third and succeeding pass: 15 to 25% | About 98% | 12 |
| Comparative example 1 | | First pass: about 60% Second pass: about 40% Third and succeeding pass: 30 to 40% | | 8 |
| Comparative example 2 | 0.2 mm | First pass: about 50% Second pass: about 30% Third and succeeding pass: 20 to 30% | About 92% | 8 |
| Comparative example 3 | | First pass: about 60% Second pass: about 40% Third and succeeding pass: 30 to 40% | | 5 |

As shown in Table 1, Example 1 is a rolled copper foil according to the preferred embodiment of the invention. Comparative example 1 is a rolled copper foil out of the invention-defined range in relation to the working ratio per one pass in the final cold rolling step. Comparative example 2 is a rolled copper foil out of the invention-defined range in relation to the total working ratio in the final cold rolling step. Comparative example 3 is a rolled copper foil out of the invention-defined range in relation to both the total working ratio and the working ratio per one pass in the final cold rolling step.

(Crystal Grain Alignment of Rolled Copper Foil after Final Cold Rolling Step)

For various XRD measurements (2θ/θ measurement, rocking curve measurement, pole figure measurement, in-plane alignment measurement), an X-ray diffraction apparatus (manufactured by Rigaku Corp. Model: RAD-B) is used. The Cu is used as an anticathode (target), and then a tube voltage and a tube current are set to be 40 kV and 30 mA, respectively. Further, the size of a specimen served for the XRD measurement is about 15× about 15 mm$^2$.

The XRD 2θ/θ measurement is conducted by using a general wide angle goniometer under the condition within a range of 2θ=30° to 100°. The slit conditions of the 2θ/θ measurement are a diverging slit of 1°, a photoreceiving slit of 0.15 mm and a scattering slit of 1°.

Further, in the XRD pole figure measurement, the $\{111\}_{Cu}$ plane diffraction is measured by using a general Schultz reflection method while scanning the β-axis (in-plane rotation of 0° to 360°) on every 1° step in the range of α=15° to 90° (α=90° is defined as the normal direction to the rolled surface). 2θ value is set to 2θ≈43°, which is a result of preliminary measurement on every specimen. The slit conditions used are diverging slit=1°, scatting slit=7 mm, photoreceiving slit=7 mm, and Schultz slit (slit height of 1 mm).

Figure 10A:
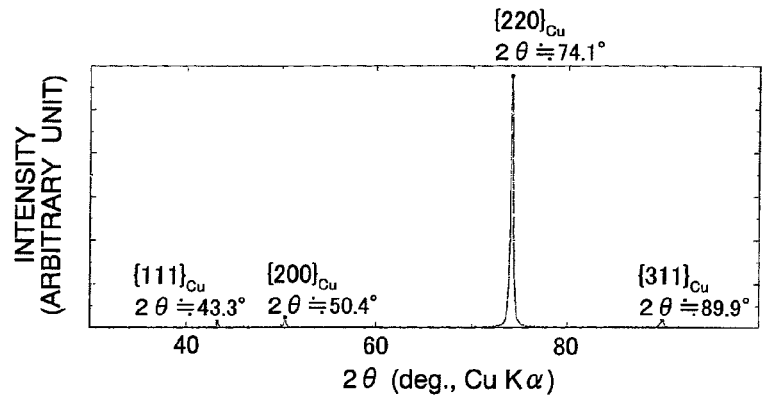
FIGS. 10A to 10D are examples of a diffraction pattern by an X-ray diffraction 2θ/θ measurement to a rolled surface on a rolled copper foil after a final cold rolling step and before a recrystallization annealing, FIG. 10A; Example 1, FIG. 10B; Comparative example 1, FIG. 10C; Comparative example 2, and FIG. 10D; Comparative example 3.
Figure 10B:
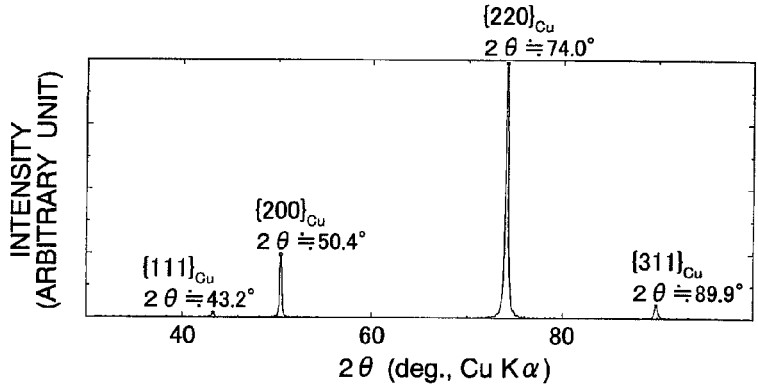
Figure 10C:
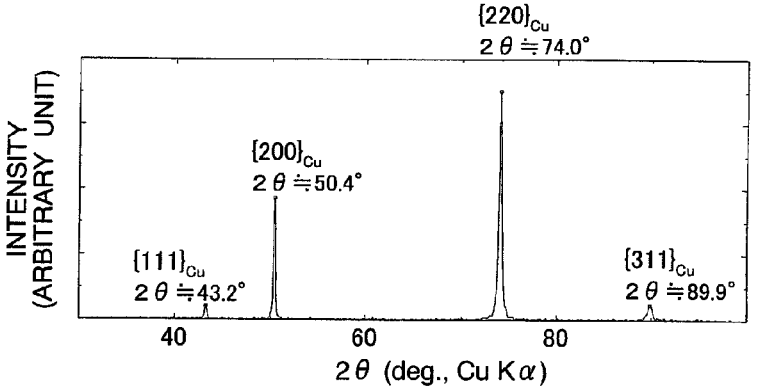
Figure 10D:
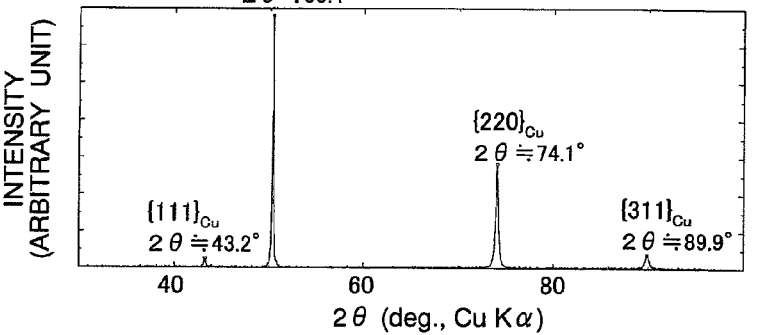

For each of the rolled copper foils (16 μm thickness) manufactured under the conditions as shown in Table 1 (after final cold rolling step and before recrystallization annealing), The XRD 2θ/θ measurement to the rolled surface and the pole figure measurement of the $\{111\}_{Cu}$ plane are conducted. FIGS. 10A to 10D show examples of a diffraction pattern by the XRD 2θ/θ measurement to the rolled surface after the final cold rolling step and before the recrystallization annealing. FIG. 10A shows Example 1, FIG. 10B shows Comparative example 1, FIG. 10C shows Comparative example 2, and FIG. 10D shows Comparative example 3.

For the results of each measurements shown in FIG. 10, Table 2 shows the relative intensity to the strongest diffraction peak being defined as 100 and the occupation ratio of the $\{220\}_{Cu}$ plane.

TABLE 2

Relative intensity to strongest diffraction peak being defined as 100 and occupation ratio of $\{220\}_{Cu}$ plane.

| | $\{111\}_{Cu}$ | $\{200\}_{Cu}$ | $\{220\}_{Cu}$ | $\{311\}_{Cu}$ | Occupation ratio of $\{220\}_{Cu}$ plane |
|---|---|---|---|---|---|
| Example 1 | 2 | 4 | 100 | 3 | About 92% |
| Comparative example 1 | 2 | 25 | 100 | 5 | About 76% |
| Comparative example 2 | 6 | 53 | 100 | 6 | About 61% |
| Comparative example 3 | 4 | 100 | 41 | 6 | About 27% |

As shown in FIGS. 10A to 10D and Table 2, it is found that a good rolled texture strongly oriented to the $\{220\}_{Cu}$ plane (occupation ratio of $\{220\}_{Cu}$ plane≈92%) is formed in Example 1. On the contrary, it is found that the $\{200\}_{Cu}$ plane is detected strongly and the occupation ratio of the $\{220\}_{Cu}$ plane is also less than 80% in Comparative examples 1 to 3.

Figure 11A:
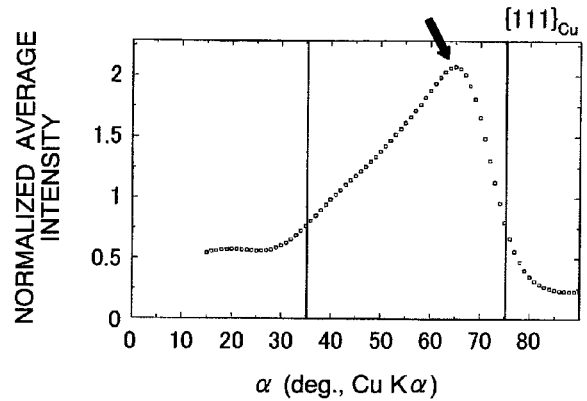
FIG. 11A is an example of a normalized average intensity of the $\{111\}_{Cu}$ plane diffraction as a function of α angle by an XRD pole figure measurement to a rolled surface in Example 1.
Figure 11B:
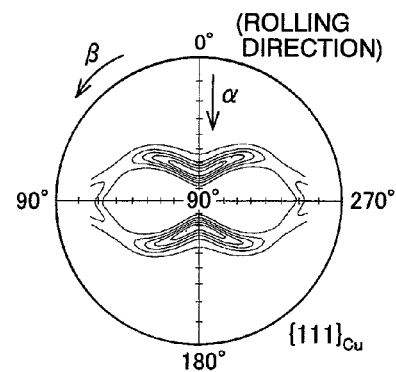
FIG. 11B is an example of a diffraction pattern of the $\{111\}_{Cu}$ plane by the XRD pole figure measurement to the rolled surface in Example 1.

FIG. 11A shows an example of a normalized average intensity of the $\{111\}_{Cu}$ plane diffraction as a function of α angle by the XRD pole figure measurement to the rolled surface in Example 1; and FIG. 11B shows an example of a diffraction pattern of the $\{111\}_{Cu}$ plane by the XRD pole figure measurement to the rolled surface in Example 1.

Figure 12A:
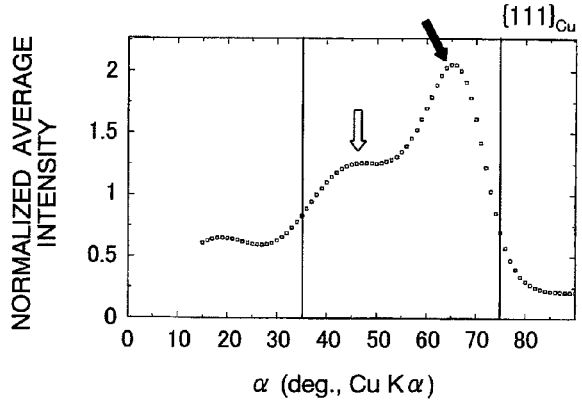
FIG. 12A is an example of a normalized average intensity of the $\{111\}_{Cu}$ plane diffraction as a function of α angle by an XRD pole figure measurement to a rolled surface in Comparative example 1.
Figure 12B:
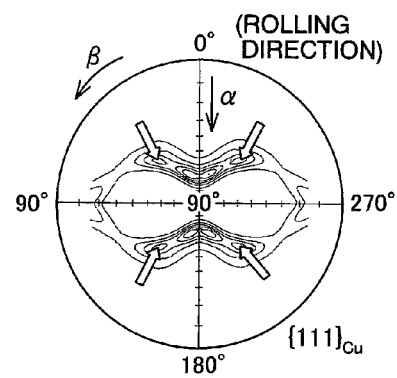
FIG. 12B is an example of a diffraction pattern of the $\{111\}_{Cu}$ plane by the XRD pole figure measurement to the rolled surface in Comparative example 1.

FIG. 12A shows an example of a normalized average intensity of the $\{111\}_{Cu}$ plane diffraction as a function of α angle by the XRD pole figure measurement to the rolled surface in Comparative example 1; and FIG. 12B shows an example of a diffraction pattern of the $\{111\}_{Cu}$ plane by the XRD pole figure measurement to the rolled surface in Comparative example 1.

Figure 13A:
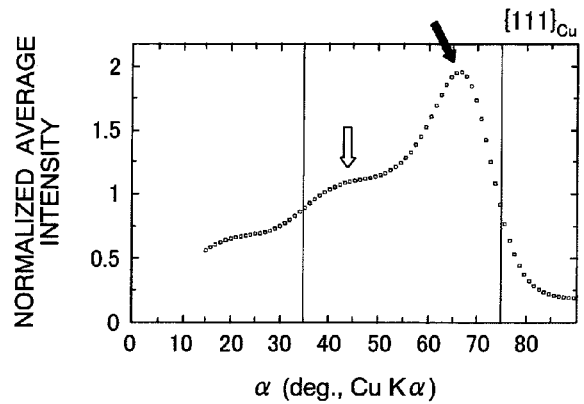
FIG. 13A is an example of a normalized average intensity of the $\{111\}_{Cu}$ plane diffraction as a function of α angle by an XRD pole figure measurement to a rolled surface in Comparative example 2.
Figure 13B:
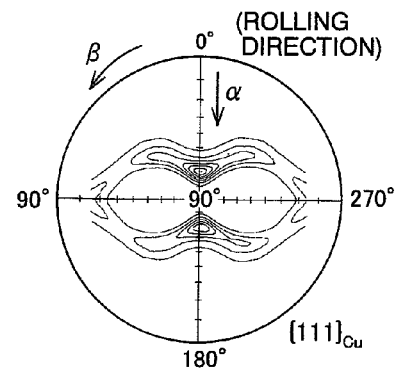
FIG. 13B is an example of a diffraction pattern of the $\{111\}_{Cu}$ plane by the XRD pole figure measurement to the rolled surface in Comparative example 2.

FIG. 13A shows an example of a normalized average intensity of the $\{111\}_{Cu}$ plane diffraction as a function of α angle by the XRD pole figure measurement to the rolled surface in Comparative example 2; and FIG. 13B shows an example of a diffraction pattern of the $\{111\}_{Cu}$ plane by the XRD pole figure measurement to the rolled surface in Comparative example 2.

Figure 14A:
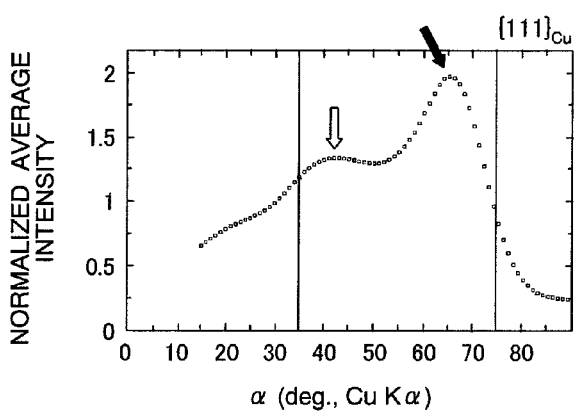
FIG. 14A is an example of a normalized average intensity of the $\{111\}_{Cu}$ plane diffraction as a function of α angle by an XRD pole figure measurement to a rolled surface in Comparative example 3.
Figure 14B:
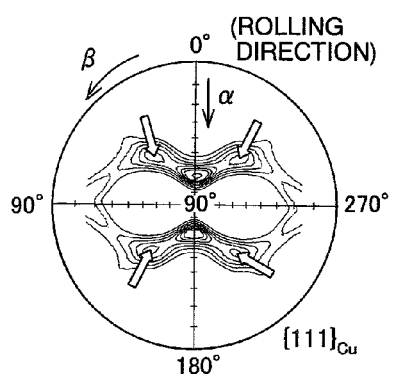
FIG. 14B is an example of a diffraction pattern of the $\{111\}_{Cu}$ plane by the XRD pole figure measurement to the rolled surface in Comparative example 3.

FIG. 14A shows an example of a normalized average intensity of the $\{111\}_{Cu}$ plane diffraction as a function of α angle by the XRD pole figure measurement to the rolled surface in Comparative example 3; and FIG. 14B shows an example of a diffraction pattern of the $\{111\}_{Cu}$ plane by the XRD pole figure measurement to the rolled surface in Comparative example 3.

In FIGS. 11A, 12A, 13A and 14A, arrows (black and white) in the figure show portions where the normalized average intensity has a step-shape or a maximal region. As shown in the figures, it is found that there is substantially only by one maximal region (black arrow) in a range of α=35° to 75° in Example 1, whereas at least two portions of a step-shape or maximal region (black and white arrows) exist within the same range in Comparative examples 1 to 3.

Corresponding to the maximal regions in the range of α=40° to 45° (white arrow) in FIGS. 12A and 14A, the fourfold symmetric diffraction peaks are confirmed by the white arrows as shown in FIGS. 12B and 14B, respectively. It can be considered that the fourfold symmetric diffraction peaks are attributed to the partial recrystallization phenomenon in the course of the cold rolling. Further, in Comparative examples 1 and 3, the condition of the working ratio per one pass in the final cold rolling step is larger than the invention-defined range (refer to Table 1). Therefore, it suggests that the working ratio per one pass gives a strong effect on the partial recrystallization phenomenon in the course of the cold rolling.

On the other hand, in FIG. 13B, the fourfold symmetric diffraction peaks corresponding to the stepwise region in the range of α=40° to 45° are not confirmed. However, in Comparative example 2, the condition of the total working ratio in the final cold rolling step is smaller than the invention-defined range (refer to Table 1). Therefore, it can be considered that the crystal rotation phenomenon of copper crystals during the cold rolling is insufficient and, accordingly the stepwise region in the range of α=40° to 45° in FIG. 13A is detected.

Considering the above results of Tables 1 and 2, and FIGS. 10A to 14B collectively, it is considered that as the working ratio per one pass increases more than the invention-defined range, the partial recrystallization phenomenon in the course of the cold rolling is induced, and then the $\{200\}_{Cu}$ plane diffraction is detected strongly in the 2θ/θ measurement and the fourfold symmetric diffraction peaks are observed in the pole figure measurement. Further, it is considered that as the total working ratio decreases less than the invention-defined range, the crystal rotation phenomenon of copper crystals during the cold rolling becomes insufficient, and then the $\{200\}_{Cu}$ plane diffraction is also observed intensely in the 2θ/θ measurement. Accordingly, it is confirmed for Comparative example 3 that the diffraction intensity of the $\{200\}_{Cu}$ plane is stronger than that of the $\{220\}_{Cu}$ plane "$I_{\{200\}Cu} > I_{\{220\}Cu}$" in the 2θ/θ measurement because of the combined phenomena by the above factors.

Relationship between the working condition of the final cold rolling step and the crystal grain alignment of the cold rolled copper foil is to be summarized. In the final cold rolling step before the recrystallization annealing, by controlling the total working ratio to be 94% or more, controlling the working ratio per one pass to be 15 to 50% and, particularly, controlling the ratio such that "working ratio at first pass"≧"working ratio at second pass"≧"working ratio at third pass", as well as controlling the working ratio at the third or more passes to be 15 to 25%, it is possible to suppress the partial recrystallization phenomenon in the course of the final cold rolling step and to achieve a good $\{220\}_{Cu}$ plane orientation (rolled texture) with promotion of the crystal rotation phenomenon of the copper crystals.

On the other hand, in a case where "total working ratio" or "working ratio per one pass" is out of the invention-defined range, it causes the partial recrystallization phenomenon or the insufficient crystal rotation in the course of the cold rolling to inhibit effective formation of the $\{220\}_{Cu}$ plane alignment (rolled texture) in the rolled copper foil. Further, the partial recrystallization phenomenon or the insufficient crystal rotation in the course of the cold rolling can be discriminated by the XRD pole figure measurement of the $\{111\}_{Cu}$ plane to the rolled surface (particularly, normalized average intensity of the $\{111\}_{Cu}$ plane diffraction measured by β-scanning at each α angles).

(Crystal Grain Alignment of Rolled Copper Foil after Recrystallization Annealing)

The rolled copper foils manufactured as described above (16 μm thickness, as cold rolled in the final cold rolling step) are heated up to a temperature of 180° C. and held for 60 min as a recrystallization annealing. After the recrystallization annealing, the crystal grain alignment of each foils is measured by using an X-ray diffraction apparatus.

When the occupation ratio of the $\{200\}_{Cu}$ plane of the cubic texture is evaluated by the XRD 2θ/θ measurement (average of each five specimens), it is about 94% for Example 1, about 91% for Comparative example 1, about 89% for Comparative example 2, and about 88% for Comparative example 3.

Further, the XRD rocking curve measurement is conducted as described below. Fixing a detector to a 2θ value of the $\{200\}_{Cu}$ plane obtained by the XRD 2θ/θ measurement and scanning the sample in the range of θ=15° to 35°, a full width at half maximum (FWHM$_{\{200\}}$) and an integration width (IW$_{\{200\}}$) of the $\{200\}_{Cu}$ plane diffraction are evaluated and the ratio thereof (IW$_{\{200\}}$/FWHM$_{\{200\}}$) is calculated. The slit conditions of the rocking curve measurement are the diverging slit of 1°, photoreceiving slit of 0.15 mm and the scattering slit of 1°, in the same manner as those of the 2θ/θ measurement.

Further, the XRD in-plane alignment measurement is conducted as described below. At first, the 2θ value of the $\{111\}_{Cu}$ plane of each specimen is measured as follows. For example, β value of the strongest peak of the $\{111\}_{Cu}$ plane diffraction is found in the in-plane alignment measurement by setting the 2θ value such as from JCPDS and the α value of 35°. Then, the 2θ value of the $\{111\}_{Cu}$ plane diffraction of the specimen is obtained in the 2θ/θ measurement by setting the α value of 35° and the β value obtained above. After that, the fourfold symmetric diffraction peaks of the specimen are measured in the in-plane alignment measurement by conducting the β-axis scanning (β=0° to 360°) and setting the α value of 35° and the 2θ value obtained above. The full width at half maximum (FWHM$_{\{111\}}$) and the integration width (IW$_{\{111\}}$) of the $\{111\}_{Cu}$ plane diffraction peaks are evaluated to calculate the ratio (IW$_{\{111\}}$/FWHM$_{\{111\}}$) and the average of the full width at half maximum (ave–FWHM$_{\{111\}}$).

Figure 15:
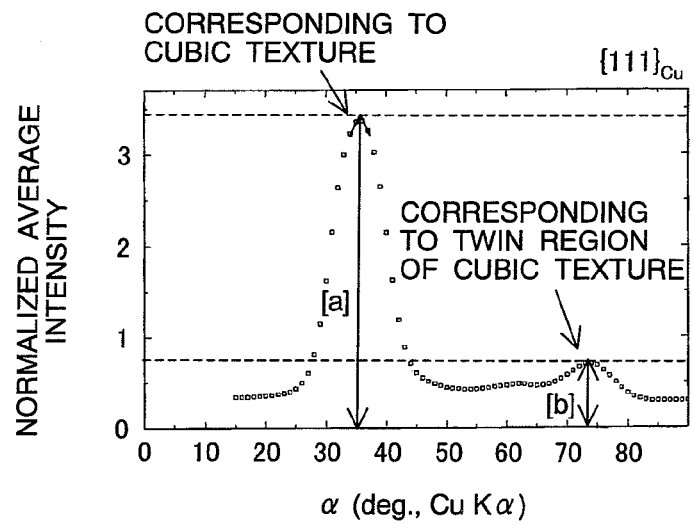
FIG. 15 is an example of a normalized average intensity of the $\{111\}_{Cu}$ plane diffraction as a function of α angle by an XRD pole figure measurement to a rolled surface in Example 1 applying a recrystallization annealing after a final cold rolling step.
Figure 16:
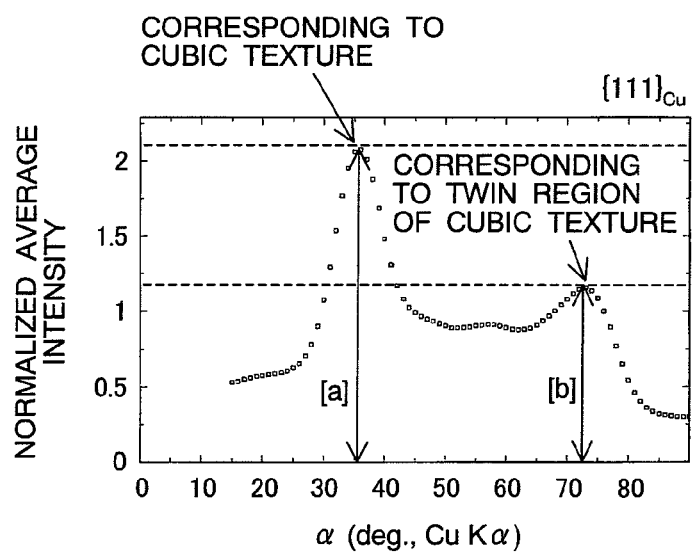
FIG. 16 is an example of a normalized average intensity of the $\{111\}_{Cu}$ plane diffraction as a function of α angle by an XRD pole figure measurement to a rolled surface in Comparative example 3 applying a recrystallization annealing after a final cold rolling step.

Further, the normalized average intensity ratio of the $\{111\}_{Cu}$ plane diffraction is evaluated as described below. In the XRD pole figure measurement by the Schultz reflection method (the intensity of the $\{111\}_{Cu}$ plane diffraction is measured by scanning the β angle of 0° to 360° on every 1° step within a range of α=15° to 90°), the ratio between the normalized average intensity of the $\{111\}_{Cu}$ plane at α=35° [a] and that at α=74° [b] is determined. FIG. 15 shows an example of the normalized average intensity of the $\{111\}_{Cu}$ plane diffraction as a function of α angle in Example 1. FIG. 16 shows an example of the normalized average intensity of the $\{111\}_{Cu}$ plane diffraction as a function of α angle in Comparative example 3.

The results of various XRD measurements described above to the rolled copper foils after the recrystallization annealing are shown in Table 3.

tation of the cubic texture and/or more twin region to the $\{200\}_{Cu}$ plane in the cubic texture.

(Average Crystal Grain Size of Rolled Copper Foil after Recrystallization Annealing)

The average crystal grain size of the rolled copper foil (16 μm thickness, after recrystallization annealing) is evaluated as described below. After etching the surface of rolled copper foils with an absorbent cotton wetted with a mixed solution of hydrogen peroxide solution (e.g., No. 080-01186, manufactured by Wako Pure Chemical Industries Ltd.) and ammonia solution (e.g., No. 017-03176, manufactured by Wako Pure chemical Industries Ltd.) (10 ml of ammonia solution+2 or 3 drops of hydrogen peroxide solution) (wiping the surface to be etched once or twice with the wetted absorbent cotton), a photograph of the microstructure on the metal surface is taken

TABLE 3

Results of XRD measurements to rolled copper foils after recrystallization annealing (average of five specimens respectively).

| | Occupation ratio of $\{200\}_{Cu}$ plane | Measuring method | Full width at half maximum | Integration width | $IW_{\{111\}}/FWHM_{\{111\}}$ | Normalized average intensity ratio ([a]/[b]) |
|---|---|---|---|---|---|---|
| Example 1 | About 94% | Rocking curve | About 7.8° | About 8.2° | About 1.1 | About 4.5 |
| | | In-plane alignment | About 8.3°* | About 8.4° | About 1.0 | |
| Comp. example 1 | About 91% | Rocking curve | About 8.6° | About 9.4° | About 1.1 | About 2.9 |
| | | In-plane alignment | About 8.8°* | About 10.4° | About 1.2 | |
| Comp. example 2 | About 89% | Rocking curve | About 7.3° | About 8.7° | About 1.2 | About 2.0 |
| | | In-plane alignment | About 9.8°* | About 12.3° | About 1.3 | |
| Comp. example 3 | About 88% | Rocking curve | About 10.4° | About 12.5° | About 1.2 | About 1.7 |
| | | In-plane alignment | About 11.8°* | About 14.9° | About 1.3 | |

*The result of full width at half maximum in the in-plane alignment measurement shows the average of the full width at half maximum (ave – $FWHM_{\{111\}}$).

The relationship of the crystal grain alignment of the rolled copper foil before and after the recrystallization annealing is to be summarized. As shown in Table 3, the rolled copper foil formed by applying the recrystallization annealing to a rolled copper foil having the crystal grain alignment as shown in FIG. 10A or FIGS. 11A and 11B shows a good cubic texture of extremely high three-axis orientation in the view of indexes for "occupation ratio of $\{200\}_{Cu}$ plane", "$FWHM_{\{200\}}$", "ave-$FWHM_{\{111\}}$", "$IW_{\{200\}}/FWHM_{\{200\}}$", and "$IW_{\{111\}}/FWHM_{\{111\}}$". Further, the index for the normalized average intensity ratio "[a]/[b]" shows that the rolled copper foil in Example 1 has less twin region to the $\{200\}_{Cu}$ plane at the rolled surface in addition to the good three-axis orientation of the cubic texture.

On the contrary, rolled copper foils formed by applying the recrystallization annealing to the rolled copper foils having the crystal grain alignment as shown in FIGS. 10B to 10D and FIGS. 12A and 12B to 14A and 14B show poor index of one or more as shown in Table 3, and have less three-axis orienby using an optical microscope (model: PMG3, manufactured by Olympus Co.). The average crystal grain size is estimated using the photograph according to the cutting method of JIS H 0501. The results are shown in Table 4.

TABLE 4

Result of average crystal grain size measurement for rolled copper foil (oxygen-free copper) after recrystallization annealing (average of five specimens respectively).

| | Average crystal grain size |
|---|---|
| Example 1 | About 71 μm |
| Comparative example 1 | About 34 μm |
| Comparative example 2 | About 8.5 μm |
| Comparative example 3 | About 6.9 μm |

As shown in Table 4, it is confirmed that the rolled copper foil of Example 1 has an extremely large average crystal grain size compared with Comparative examples 1 to 3. It is considered that this result is attributed to the rolled copper foil in Example 1 with extremely high three-axis orientation of the cubic texture and with less twin region to the $\{200\}_{Cu}$ plane (refer to Table 3).

(Flexible Fatigue Property of Rolled Copper Foil after Recrystallization Annealing)

Figure 17:
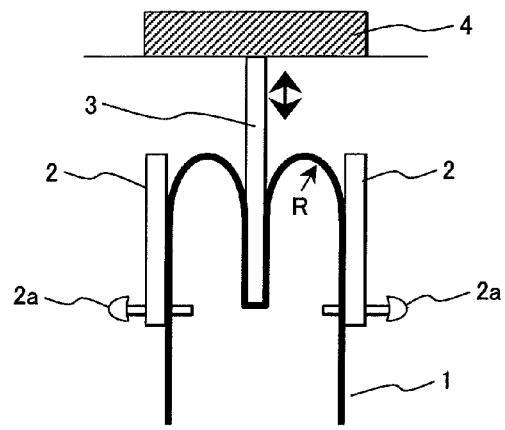
FIG. 17 is a schematic illustration showing the outline of flexible fatigue property measurement (IPC-based fatigue test).

The flexible fatigue property of the rolled copper foils (16 μm thickness, after recrystallization annealing) is evaluated as described below. FIG. 17 shows a schematic illustration showing the outline for flexible fatigue property measurement (IPC-based fatigue test). A IPC-based fatigue test apparatus (model: SEK-31B2S manufactured by Shinetsu Engineering Co.) is used, and the flexible fatigue property is measured under the conditions of R=2.5 mm, an amplitude stroke=10 mm, frequency=25 Hz (amplitude velocity=1500 cycles/min), specimen width=12.5 mm, specimen length=220 mm, and the longitudinal direction of a specimen being as the rolling direction. The results are shown in Table 5.

TABLE 5

Result of IPC-based fatigue test to rolled copper foil (oxygen-free copper) after recrystallization annealing (average of five specimens respectively).

| | Number of cycles to failure (Cycles until rupture of bent portion) |
|---|---|
| Example 1 | $6.6 \times 10^6$ |
| Comparative example 1 | $3.2 \times 10^6$ |
| Comparative example 2 | $1.0 \times 10^6$ |
| Comparative example 3 | $0.9 \times 10^6$ |

As shown in Table 5, it is confirmed that the rolled copper foil of Example 1 has more than twice longer flexible fatigue life (high flexible fatigue property) than Comparative examples 1 to 3. It is considered that this result is attributed to the rolled copper foil in Example 1 with extremely high three-axis orientation of the cubic texture, with less twin region to the $\{200\}_{Cu}$ plane (refer to Table 3), and with large average crystal grain size (refer to Table 4).

Manufacture of Examples 2 to 3 and Comparative Example 4

As the starting materials, a copper alloy with addition of 0.004 mass % Sn to the oxygen-free copper (oxygen content: 2 ppm) (Example 2), a copper alloy with addition of 0.007 mass % Sn to the oxygen-free copper (Example 3), and a copper alloy with addition of 0.01 mass % Sn to the oxygen-free copper (Comparative example 4) are melted and then cast into the ingots with 200 mm thickness and 650 mm width, respectively. Then, in accordance with the flow chart as shown in FIG. 9, each cast ingots is hot-rolled down to a thickness of 10 mm. Then, conducting the cold rolling step and the process annealing step are properly repeated to produce the green sheet having a thickness of 0.8 mm. Each green sheet is held at a temperature of 700° C. for about 1 min as the annealing step for the green sheet.

Then, rolled copper foils with a thickness of 16 μm (Examples 2 to 3 and Comparative Example 4) are manufactured by conducting the final cold rolling step under the same conditions in Example 1 (refer to Table 1). Five specimens in each example (including comparative example) are manufactured in the same manner as described above. For the rolled copper foils (after the final cold rolling), when the XRD 2θ/θ measurement to the rolled surface and the XRD pole figure measurement of the $\{111\}_{Cu}$ plane are conducted, almost the same results as those in FIG. 10A and FIGS. 11A and 11B are obtained.

Next, the softening temperature of the rolled copper foils (Examples 2 to 3 and Comparative example 4) is investigated. The softening temperature is estimated based on the tensile strength by using a universal testing instrument (model: AG-I, manufactured by Shimadzu Corporation) according to the tensile test method of JIS Z 2241. At first, the foils are cut each into a rectangular form with a width of 15 mm and a length of 200 mm (longitudinal direction=rolling direction). Then, a heat treatment is applied to each of the cut out specimens for 30 min at each of the temperatures of 50° C., 100° C., 130° C., 160° C., 180° C., 200° C., 220° C., 240° C., 260° C., 280° C., 300° C., 320° C., 340° C., and 360° C. Then, the tensile strength for each specimen after the heat treatment is measured. And the temperature at which decrease of the strength is substantially saturated (about 110 to 150 N/mm$^2$) is defined as the softening temperature (tensile strength of rolled copper foil before the heat treatment is about 380 to 480 N/mm$^2$).

As a result of the investigation described above (average of five specimens respectively), the softening temperature of Example 2 is about 180° C., that of Example 3 is about 260° C., and that of Comparative example 4 is about 320° C. The softening temperature of the rolled copper foil made of the oxygen-free copper without the Sn addition (Example 1) is about 100° C.

After applying a heat treatment to the rolled copper foils under the condition assuming the recrystallization annealing in the CCL step (holding at a temperature of 300° C. for 10 min), the average crystal grain size evaluation and flexible fatigue property measurement (IPC-based fatigue test) same as described above are conducted. Table 6 shows the result of the average crystal grain size and Table 7 shows the result of the flexible fatigue property.

TABLE 6

Result of average grain size measurement for rolled copper foils (copper alloy) after heat treatment (average of five specimens respectively).

| | Average crystal grain size |
|---|---|
| Example 2 | About 65 μm |
| Example 3 | About 60 μm |
| Comparative example 4 | About 11 μm |

TABLE 7

Result of IPC-based fatigue test to rolled copper foil (copper alloy) after heat treatment (average of five specimens respectively).

| | Number of cycles to failure (Cycles until rupture of bent portion) |
|---|---|
| Example 2 | $6.7 \times 10^6$ |
| Example 3 | $6.1 \times 10^6$ |
| Comparative example 4 | $0.2 \times 10^6$ |

Considering the results of Tables 4 to 7 collectively, it is supposed that the rolled copper foils of Examples 2 and 3 have more than twice longer flexible fatigue life (high flexible fatigue property) than the conventional rolled copper foils (Comparative examples 1 to 3), since the necessary and sufficient recrystallization annealing is applied to the foils of Examples 2 and 3. Further, with the same reasons, it is confirmed that the average crystal grain size after the heat treatment has a sufficient size (40 μm or more).

Further, to the rolled copper foils of Examples 2 and 3 applied with the heat treatment described above, when the XRD 2θ/θ measurement, the rocking curve measurement of the $\{200\}_{Cu}$ plane and the XRD pole figure measurement of the $\{111\}_{Cu}$ plane (in-plane orientation measurement, evaluation of the normalized average intensity ratio) are conducted, it is confirmed that they have the crystal grain alignment with the occupation ratio of the $\{200\}_{Cu}$ plane of 90% or more, $FWHM_{\{200\}} \leq 10°$, $0.85 \leq IW_{\{200\}}/FWHM_{\{200\}} \leq 1.15$, ave-$FWHM_{\{111\}} \leq 10°$, $0.85 \leq IW_{\{111\}}/FWHM_{\{111\}} \leq 1.15$, and $[a]/[b] \geq 3$.

Figure 18A:
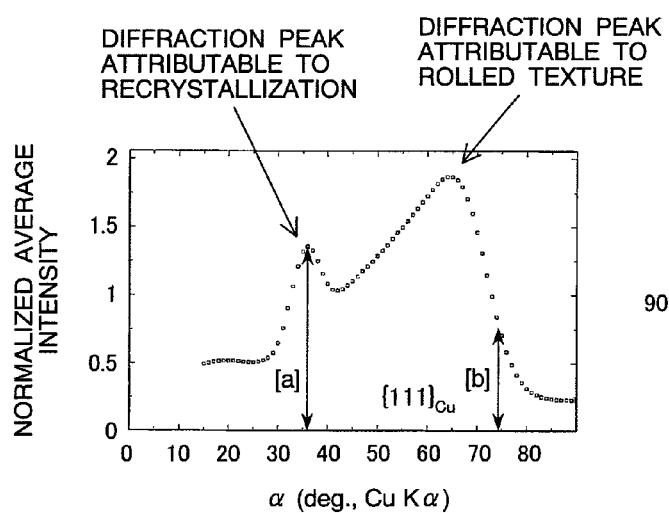
FIG. 18A is an example of a normalized average intensity of the $\{111\}_{Cu}$ plane diffraction as a function of α angle by an XRD pole figure measurement to a rolled surface in Comparative example 4.

On the other hand, Comparative example 4 with the content of the Sn additive more than the invention-defined range has the flexible fatigue property inferior to those of conventional rolled copper foils (Comparative examples 1 to 3). Then, the XRD pole figure measurement is conducted to the rolled copper foil of Comparative example 4 applied with the heat treatment described above. FIG. 18A shows an example of the normalized average intensity of the $\{111\}_{Cu}$ plane diffraction as a function of α angle by the XRD pole figure measurement to the rolled surface in Comparative example 4; and FIG. 18B shows an example of the diffraction pattern of the $\{111\}_{Cu}$ plane thereof.

Figure 18B:
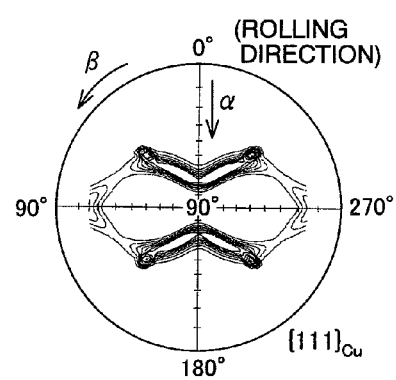
FIG. 18B is an example of a diffraction pattern of the $\{111\}_{Cu}$ plane by the XRD pole figure measurement to the rolled surface in Comparative example 4.

As shown in FIGS. 18A and 18B, it is found that the normalized average intensity ratio is $[a]/[b] \leq 3$, and that the diffraction attributed to the recrystallization and the diffraction attributed to the rolled texture are coexistent. It is supposed that the recrystallization annealing applied to the foil in Comparative example 4 is insufficient because of the excessive content of the Sn additive than the invention-defined range.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A rolled copper foil made of a tough pitch copper or an oxygen-free copper, and obtained after a final cold rolling step but before a recrystallization annealing, and having a crystal grain alignment wherein, in results obtained by an X-ray diffraction pole figure measurement with respect to a rolled surface of the rolled copper foil, the crystal grain alignment indicates that a normalized average intensity of a $\{111\}_{Cu}$ plane diffraction of copper crystal, which is obtained by β-scanning in a range of α angle of 35° to 75° is not a stepwise form, or has substantially only one maximal region.

2. The rolled copper foil according to claim 1, wherein:
in results obtained by an X-ray diffraction 2θ/θ measurement with respect to the rolled surface, 80% or more of diffraction peaks of the copper crystal occurs on a $\{220\}_{Cu}$ plane.

3. The rolled copper foil according to claim 1, wherein: the rolled copper foil is made of a copper alloy comprising 0.001 to 0.009 mass % of Sn and a balance being Cu and an inevitable impurity.

4. The rolled copper foil according to claim 3, wherein the rolled copper foil is made by a method, comprising:
preparing an ingot made of the copper alloy;
conducting a hot rolling step;
conducting a plurality of times a step comprising the sub-steps of conducting a cold rolling step and then a process annealing step; and
conducting a final cold rolling step to produce the rolled copper foil of a predetermined thickness;
wherein a total working ratio in the final cold rolling step before a recrystallization annealing is 94% or more; and
a working ratio per one pass in a final cold rolling step is 15 to 50%.

5. The rolled copper foil according to claim 4, wherein:
a working ratio of one pass in the final cold rolling step is "working ratio at first pass"≧"working ratio at second pass"≧"working ratio at third pass"; and
a working ratio at third or more passes in a final cold rolling step is 15 to 25%.

6. The rolled copper foil according to claim 1, wherein the rolled copper foil is made by a method, comprising:
preparing an ingot made of the tough pitch copper or the oxygen-free copper;
conducting a hot rolling step;
conducting a plurality of times a step comprising the sub-steps of conducting a cold rolling step and then a process annealing step; and
conducting a final cold rolling step to produce the rolled copper foil of a predetermined thickness;
wherein a total working ratio in the final cold rolling step before a recrystallization annealing is 94% or more; and
a working ratio per one pass in a final cold rolling step is 15 to 50%.

7. The rolled copper foil according to claim 6, wherein:
a working ratio of one pass in the final cold rolling step is "working ratio at first pass"≧"working ratio at second pass"≧"working ratio at third pass"; and
a working ratio at third or more passes in a final cold rolling step is 15 to 25%.

8. The rolled copper foil according to claim 1, wherein:
in results obtained by an X-ray diffraction 2θ/θ measurement with respect to the rolled surface, occupation ratio of a $\{200\}_{cu}$ plane of the copper crystal is 80% or more.

9. The rolled copper foil according to claim 1, wherein the rolled copper foil is made of an oxygen free copper.

10. The rolled copper foil according to claim 1, wherein the rolled copper foil is made of tough pitch copper.

* * * * *